(12) United States Patent
Wang

(10) Patent No.: US 9,437,698 B2
(45) Date of Patent: Sep. 6, 2016

(54) SEMICONDUCTOR DEVICE INCLUDING A GATE STRUCTURE WRAPPED AROUND A FIN STRUCTURE

(71) Applicant: Taiwan Semiconductor Manufacturing Company Limited, Hsinchu (TW)

(72) Inventor: Tai-Yuan Wang, New Taipei (TW)

(73) Assignee: Taiwan Semiconductor Manufacturing Company Lmited, Hsinchu (TW)

( * ) Notice: Subject to any disclaimer, the term of this patent is extended or adjusted under 35 U.S.C. 154(b) by 0 days.

(21) Appl. No.: 14/476,846

(22) Filed: Sep. 4, 2014

(65) Prior Publication Data

US 2016/0071945 A1 Mar. 10, 2016

(51) Int. Cl.
*H01L 29/423* (2006.01)
*H01L 29/06* (2006.01)
*H01L 29/10* (2006.01)
*H01L 29/08* (2006.01)
*H01L 29/786* (2006.01)
*H01L 29/66* (2006.01)
*H01L 21/306* (2006.01)

(52) U.S. Cl.
CPC ....... *H01L 29/42392* (2013.01); *H01L 21/306* (2013.01); *H01L 29/0673* (2013.01); *H01L 29/0847* (2013.01); *H01L 29/1033* (2013.01); *H01L 29/66742* (2013.01); *H01L 29/78696* (2013.01)

(58) Field of Classification Search
CPC .............. H01L 21/823431; H01L 21/823821; H01L 21/845; H01L 27/0886; H01L 27/0924; H01L 27/10826; H01L 27/10879; H01L 27/1211; H01L 29/41791; H01L 29/66795; H01L 29/66818; H01L 29/7831; H01L 29/785
See application file for complete search history.

(56) References Cited

U.S. PATENT DOCUMENTS

2015/0187909 A1* 7/2015 Yan ................... H01L 29/66484
438/424

\* cited by examiner

*Primary Examiner* — Selim Ahmed
(74) *Attorney, Agent, or Firm* — Jones Day

(57) ABSTRACT

Methods and structure for a semiconductor device is disclosed, which provides a semiconductor device that includes an integral semiconductor fin structure having a middle section defining a channel region of the semiconductor device. The middle section includes an embedded root portion protruding from an insulating surface on a substrate and a suspended overhead portion arranged above the root portion, which is separated from the overhead portion by a predetermined distance. The root portion and the overhead portion respectively define a substantially identical channel direction. The device further includes a gate structure disposed over the fin structure at the middle section. The gate structure wraps around a cross-section of the overhead portion and caps over the protruded portion of the root portion.

13 Claims, 26 Drawing Sheets

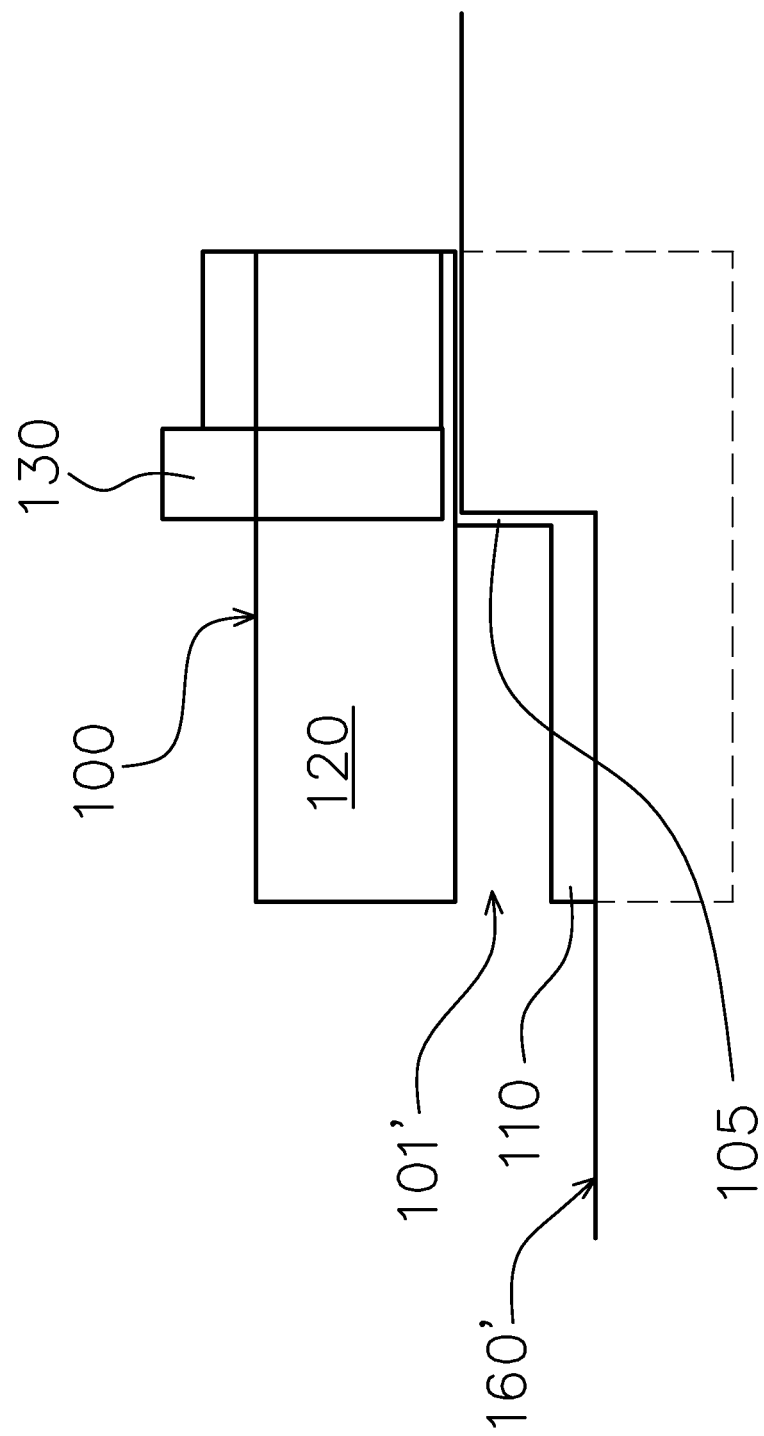

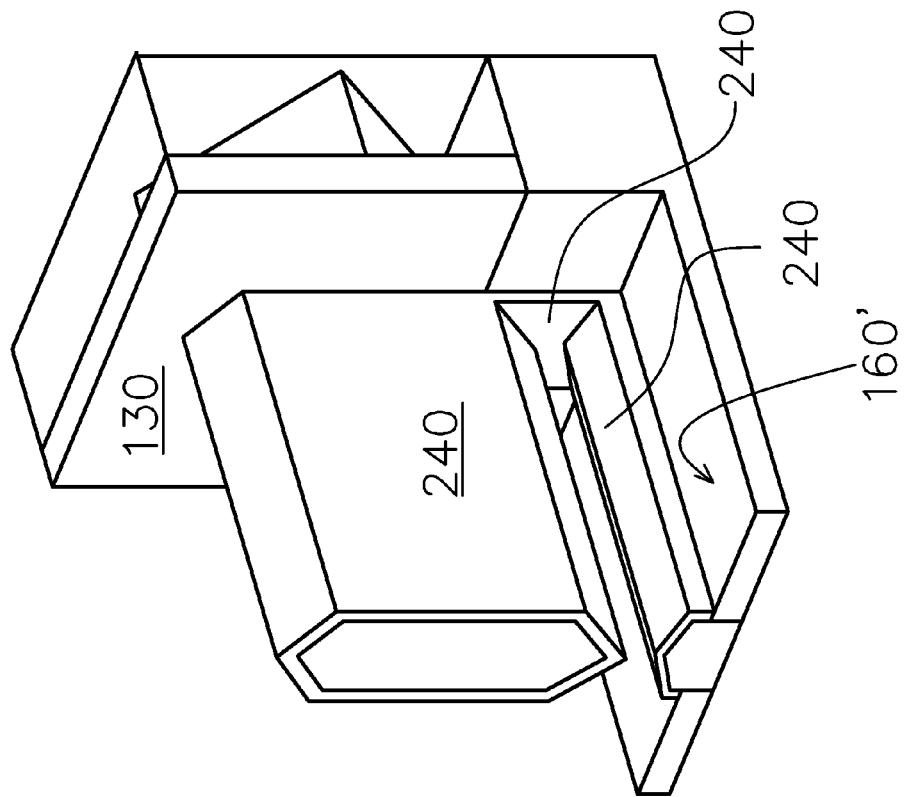

US 9,437,698 B2

SEMICONDUCTOR DEVICE INCLUDING A GATE STRUCTURE WRAPPED AROUND A FIN STRUCTURE

TECHNICAL FIELD

The present invention relates generally to semiconductor devices, and, more particularly, to semiconductor gate-all-around (GAA) structure and fabrication method thereof.

BACKGROUND

Nano-channel gate-all-around ("GAA") metal oxide field effect transistors ("MOSFET") have been shown to offer performance gains over fin channel MOSFETs ("FinFETs"). Improvements in areas such as off-state leakage and on-state drain current have been demonstrated by the GAA MOSFET. Currently, fabrication of GAA nano-wire structures often involve epitaxial growth of alternating layers of sacrificial material and channel material on a substrate. Special etchants of high selectivity are then used to remove the underlying sacrificial material, thereby creating a suspended channel above the surface of the substrate. However, the cost for implementing epitaxial deposition is generally high, and the search for a suitable etchant of high selectivity is not always easy. Moreover, the epitaxial sacrificial layer may inevitably induce strain related defects in the nano-scale channel.

Accordingly, a gate-all-around (GAA) structure and fabrication method thereof are proposed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-G illustrate isometric and cross-sectional views of a semiconductor structure at various stages of fabrication in accordance with embodiments of the instant disclosure.

DETAILED DESCRIPTION

Figure 1A:
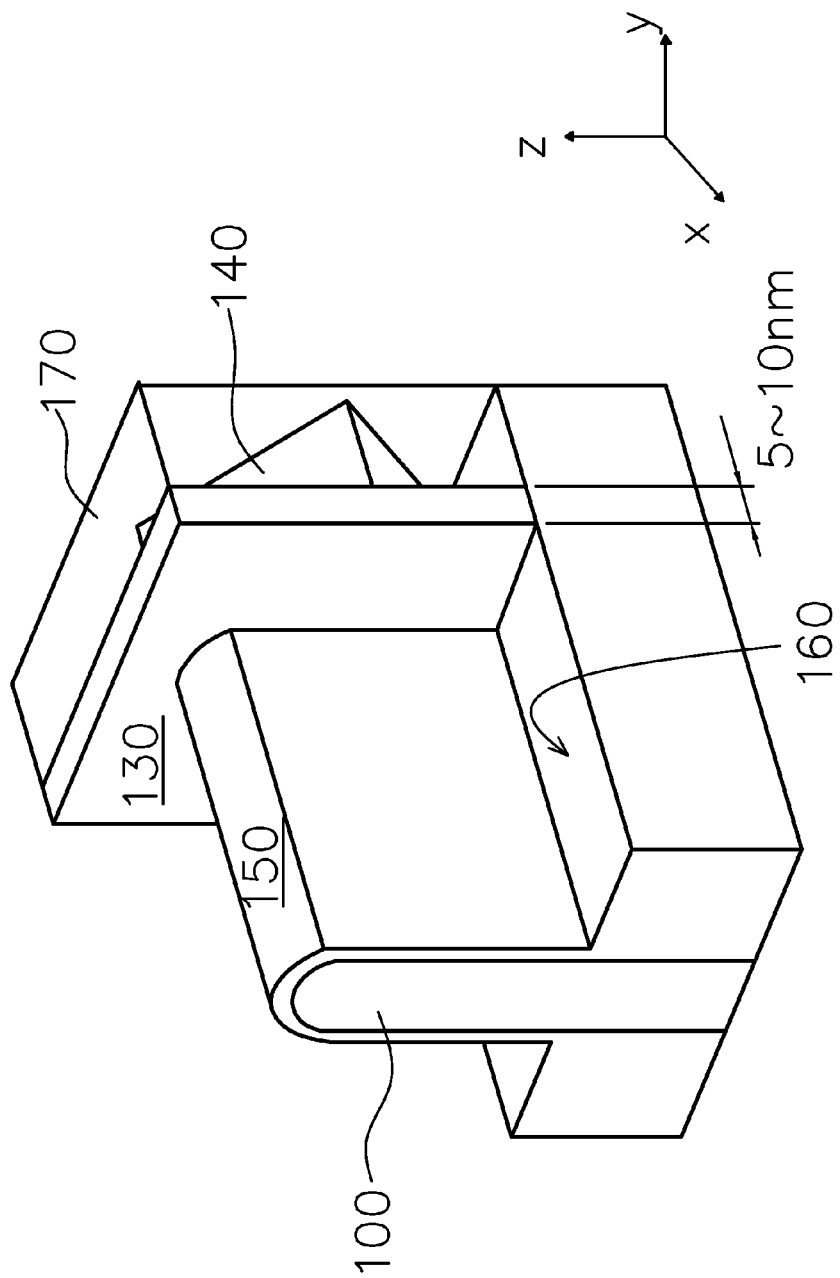
FIGS. 1A-C illustrate isometric and cross-sectional views of a semiconductor structure at one stage of fabrication in accordance with embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the ease and accuracy of orientation referral, a x-y-z coordinate reference is now provided, in which the x-axis is generally orientated along a substrate surface in the lateral extending direction of an elongated semiconductor fin structure (e.g., along the channel direction thereof), the y-axis is generally oriented along the substrate surface perpendicular to the x-axis, while the z-axis is oriented generally along the vertical direction with respect to the planar surface of a substrate (which, in most cases, defined by the x-y plane).

FIG. 1A illustrates isometric and cross-sectional views of a semiconductor structure at one stage of fabrication in accordance with embodiments of the instant disclosure. Particularly, FIG. 1A shows a portion of a semiconductor fin structure 100 arranged in and extending from an insulating surface 160 on a substrate. The structure shown in FIG. 1A may be obtained from a later stage of an established fin-field-effect-transistor (FinFET) fabrication process. Specifically, at the later stage of the FinFET fabrication process, an elongated semiconductor fin structure 100 having a root portion embedded in an insulating layer on a substrate is provided.

The substrate on which the integral fin structure 100 stands may comprise a crystalline silicon substrate (e.g., wafer). The substrate may comprise various doped regions depending on design requirements (e.g., p-type substrate or n-type substrate). The doped regions may be doped with p-type dopant, such as boron or $BF_2$; n-type dopant, such as phosphorus or arsenic; and/or combinations thereof. In some alternative embodiments, the substrate 100 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Furthermore, although a bulk substrate is utilized in the instant illustrative example, the substrate may include an epitaxial layer (epi-layer) and/or may include a silicon-on-insulator (SOI) structure with sufficiently thick STI feature embedding the root portion of the fin structure.

The fin structure 100 is generally a slim elongated erecting structure on a substrate surface made of an integral piece of semiconductor material, defined substantially by a general fin width (w) along the y-axis, a general fin height (h) along the z-axis, and a general fin length (l) along the x-axis. To achieve higher device density and enhanced performance, the fin structure 100 may be a nano-scaled semiconductor structure. In some embodiments, the fin structure may have a fin width (w) of about 7 to 14 nm, a fin height (h) of about 100 nm, and a fin length (l) of about or less than the 100 nm range, depending on the selected target channel length.

The fin structure may be formed by a top-down method, such as wet/dry etching using suitable masking/etchant combination to reduce selective regions on a semiconductor surface of a bulk substrate down to a predetermined depth. This negatively defines a vertically standing fin structure out of a masked remaining portion of the bulk substrate that protrudes from the recessed trench surfaces resulting from the etching process. Alternatively, a bottom-up method may be used, such as an epitaxial deposition of suitable semiconductor materials on a substrate surface to positively define a vertically erecting fin structure. In some embodiments, the fin structure 100 is made of silicon material out of the semiconductor substrate on which it stands. Furthermore, in some embodiments, the top portion (e.g., the tip) of the protruding fin structure is provided with a rounded surface (as shown in FIGS. 1A/B/C), thereby avoiding the formation of a sharp, acute-angled edge on the fin structure that generally leads to undesirable electrical properties that may decrease the device performance.

The insulating layer on the substrate may be a shallow trench isolation (STI) feature comprising suitable dielectric materials. The insulating layer defines an insulating surface 160 around the vertically erected (substantially along the z-axis) and horizontally extending (substantially along the x-axis) fin structure 100. In some embodiments, the STI dielectric includes oxide materials, such as silicon dioxide ($SiO_2$), though other suitable materials may also be used. The STI feature embedding the root portion of the fin structure 100 may be formed by disposing suitable dielectric materials on a recessed surface around the root portion of the fin structure 100 (e.g., the trench formed around a fin structure after a fin-definition etching step); recessing the top surface of the dielectric material down to the same height as the top surface of the fin structure; then reducing the dielectric filling by a suitable etching process down to a predetermined depth below the top surface of the fin structure. Thereby, the insulating surface 160 around the embedded portion of the fin structure 100 is formed.

Figure 1B:
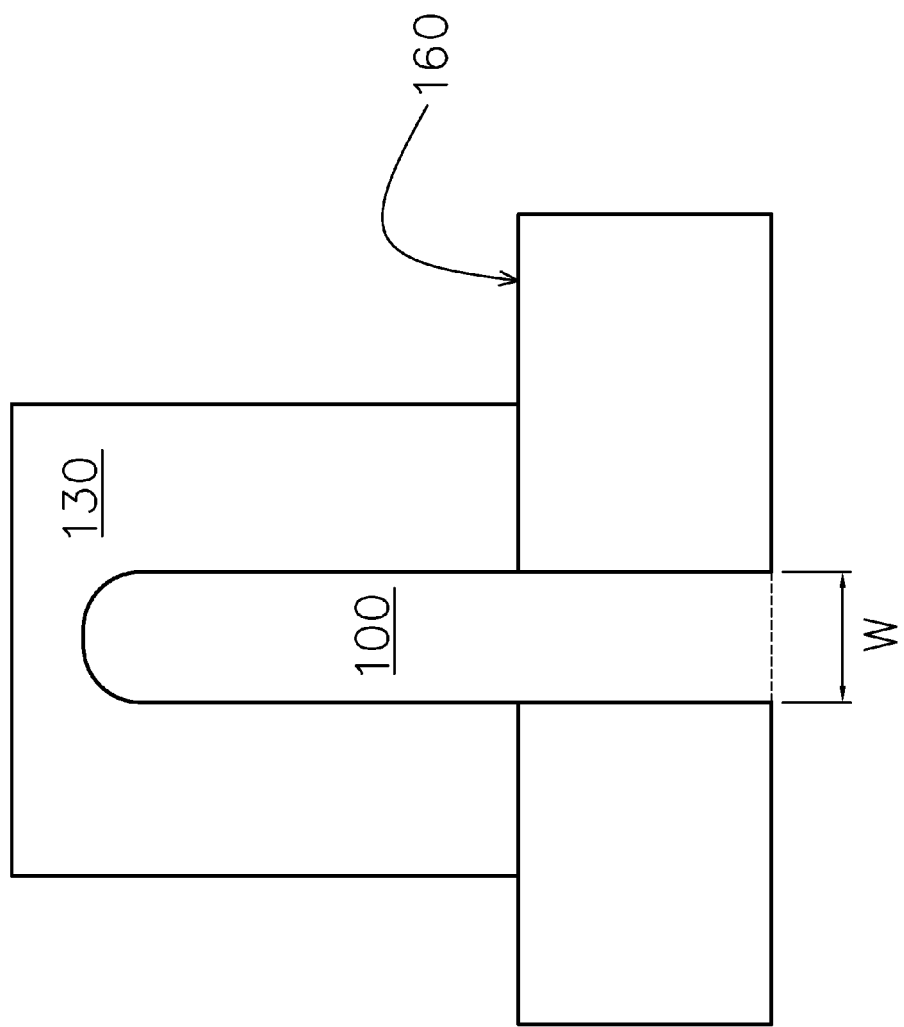
Figure 1C:
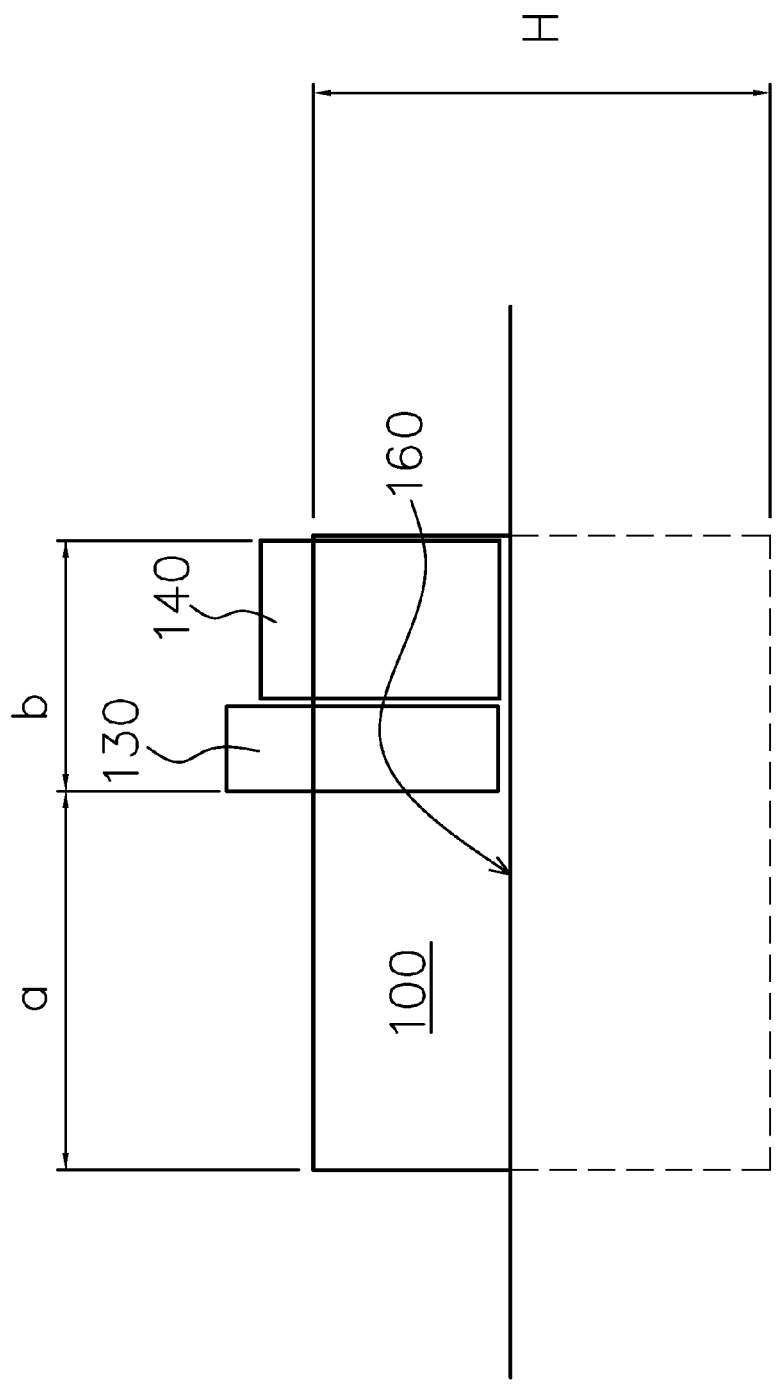

Generally, the middle section (denoted as section "a" in FIG. 1C) of the horizontally extending fin structure defines a channel region of a semiconductor device, while the two respective end sections (one of which is denoted as section "b" as shown in FIG. 1C) form the source/drain nodes 140. The source/drain nodes 140 may be protected by interlayer dielectrics 170. A pair of arch structures 130 are disposed toward the respective ends of the fin structure 100, separating the middle channel portion, (e.g., section "a") from the respective source/drain portions (e.g., section "b").

The instant partial cutaway view of FIG. 1A illustrates only about half of the fin structure, thus showing only one of the two opposing arch structures arranged toward a corresponding end of the fin structure. Structurally, the arch structure 130 saddles the protruding portion of the fin structure 100 above the insulating surface 160 in a sealing manner, locally isolating the channel region and the respective source/drain region from the isolating surface 160 up to a predetermined height above a top surface of the fin structure 100. Accordingly, the channel region of the FinFET device may be substantially defined in the middle section (e.g., section "a") of the fin structure 100 between the opposing arch structures 130. The actual structural profile and the specific location of the arch structure 130 should depend on specific operational requirements and/or practical concerns, and are not to be limited by the scale/proportion of the exemplary arrangement illustrated herein. In some embodiments, the arch structures have thickness (i.e., the width along the x-axis) of about 5 to 10 nm.

The arch structure 130 may be made of ceramic material having high thermal withstanding properties and etch resisting characteristics. In some embodiments, the arch structure 130 comprises silicon carbon nitride (SiCN), which possesses excellent resistance to heating and etching. The arch structure 130 may provide mechanical support for the slim profiled, high aspect ratio fin structure 100. Moreover, in the FinFET fabrication process, the arch structure 130 may serve as a protective shield for the middle channel section during the source/drain creation process, e.g., source/drain doping/implantation and/or source/drain epitaxial growth processes. Furthermore, the arch structure 130 may serve as a molding template for a subsequent replacement gate process, in which a dummy gate (typically made of polysilicon material) is removed and replaced with a metal gate.

At a later stage of the FinFET fabrication process, particularly after the removal of a dummy gate and before the implementation of the metal replacement-gate process, the upper protruding portion of the fin structure 100 may be covered by a layer of dielectric material 150. In the instant example, the outer surface of the upper portion of the fin structure 100, which protrudes from the insulating surface 160 of the embedding STI feature, is substantially uniformly covered by a dielectric spacer 150. The dielectric spacer 150 may be made of substantially the same oxide material as that of the STI feature, such as silicon dioxide ($SiO_2$).

FIGS. 1B and 1C show cross-sectional views of the semiconductor structure of FIG. 1A from different angles. Particularly, FIG. 1B shows a cross-sectional view of the semiconductor device along the x-axis (taken on the y-z plane), while FIG. 1C shows a cross-sectional view of the semiconductor device along the y-axis (taken on the x-z plane). Specifically, FIG. 1C shows the embedded buried portion of the fin structure 100 underneath the insulating surface 160 of the surrounding STI feature in dash lines. For clarity, the thin layer of oxide spacer 150 covering the outer surface of the fin structure 100 is not shown in this figure. The embedded lower/root portion of the integral fin structure 100 may be further in connection with a semiconductor bulk substrate (not shown in the picture). The embedding STI feature around the fin structure 100 should be sufficiently thick (i.e., the buried root portion of the integral fin structure 100 being sufficiently deep) to ensure effective implementation of the subsequent fabrication process. In some embodiments, about half of the fin height (h) of the fin structure 100 is initially embedded in the STI feature under the insulating surface 160. In some embodiments, the upper protruding portion of the fin structure 100 is about 7 to about 50 nm above the insulating surface 160 at the initial nanochannel formation stage in accordance with the instant disclosure.

Figure 2A:
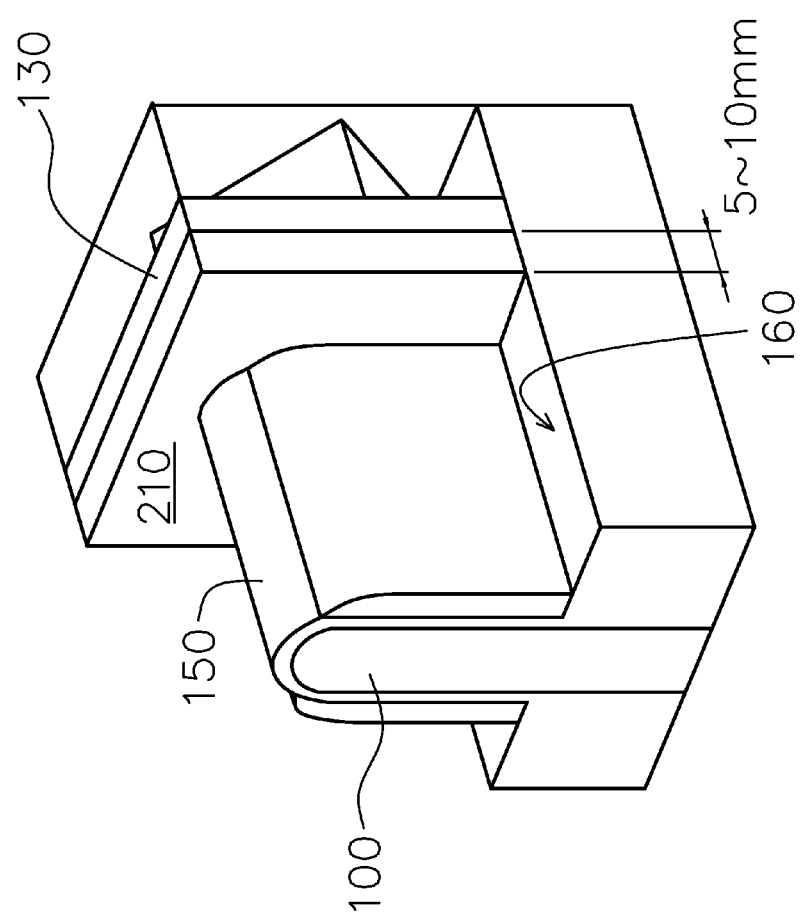

FIG. 2A illustrates an isometric view of a semiconductor structure at a vertical spacer formation stage of fabrication in accordance with embodiments of the instant disclosure. A vertically extending spacer 210 is selectively formed on the lateral surface of the oxide-covered fin structure 100 and the channel-facing side of the arch structure 130. The spacer layer 210 comprises a dielectric material having etch-selectivity different from that of the STI feature. Suitable choices for the spacer layer 210 may include materials such as silicon nitride (SiN), silicon oxynitride (SiON), or other comparable materials and combinations thereof. The spacer layer 210 may comprise a single layer or multilayer structure. The formation of the spacer layer 210 may be accomplished through established methods. In some embodiments, a blanket layer of suitable dielectric material is disposed by chemical vapor deposition (CVD), physical vapor deposition (PVD), atomic layer deposition (ALD), or other viable techniques. An anisotropic etching is then performed on the disposed dielectric layer to form the spacer layer 210 over the lateral surfaces of the vertically extending fin structure 100 and the arch structure 130. In some embodiments, the thickness of the spacer layer 210 on the lateral surface of the arch structure 130 may be from about 5 to about 10 nm.

Figure 2B:
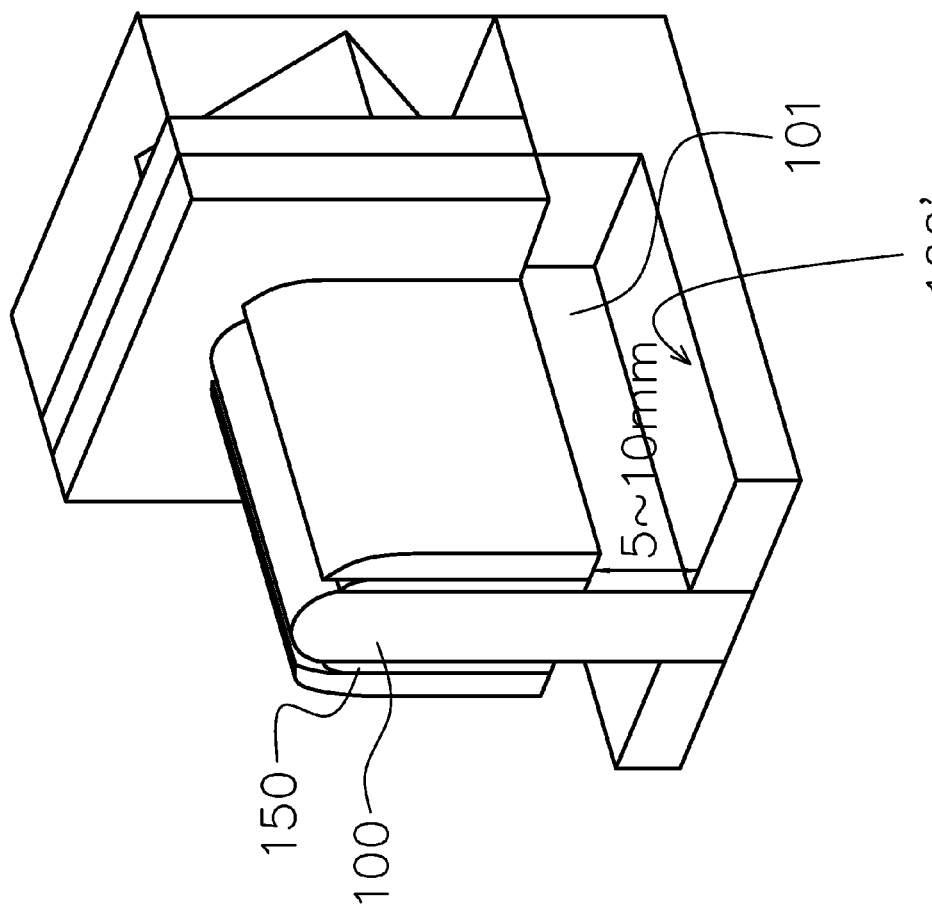

FIG. 2B illustrates an isometric view of a semiconductor structure at a local STI recessing stage of fabrication in accordance with embodiments of the instant disclosure. Specifically, a local downward STI recessing process is performed at the middle section of the fin structure 100 between the pair of arch structures 130 for exposing a lateral surface 101 that was originally embedded in the STI feature. The arch structures 130 at the middle channel section of the fin structure are used as etch masks during this process. Suitable combinations of anisotropic and isotropic etching technique may be utilized to achieve the local surface recessing of the STI feature and the selective exposure of the originally buried lateral fin wall 101 under the insulating surface 160. In some embodiments, a combination of dry and wet etching techniques is employed. For instance, a dry etching process (such as reactive-ion etching/REI) may be used to recess the STI feature around the middle section of the fin structure 100 in a substantially downward direction (in the z-direction), along with a complementary wet etching to selectively remove portions of the oxide material of the dielectric spacer 150 on the lateral surface of the semiconductor fin structure 100.

As the oxide material of the STI feature is downwardly etched, an originally embedded portion of fin structure 100 under the nitride spacer layer 210 is revealed. In addition, as the oxide material of the dielectric spacer 150 is removed, a locally exposed semiconductor fin surface 101 protruding from a newly defined recessed insulating surface 160' may be obtained. The top surface (e.g., the tip) of the fin structure 100 may also be exposed from the dielectric layer 150 as a result of the oxide removal process. Likewise, the oxide material of the STI feature around the root region of the arch structure 130 (under the nitride spacer 210) may also be laterally recessed due to the wet etching process. Therefore, attention is required to avoid over etching of the lateral oxide surface under the nitride spacer 210 around the root region of the arch structure 130 to prevent potential shorting between the channel region and the source/drain nodes of the semiconductor device.

Alternatively, in some embodiments, a combination of wet etching of different etch rate/selectivity may be employed to achieve the downward STI surface recessing. For instance, a first wet etching process of slow oxide etch rate and high oxide/nitride etch ratio may be applied in combination with a subsequent second wet etching process having a faster etch rate and higher lateral etching ability. The use of a wet etching process alone may avoid the potential negative effects caused by possible plasma remaining on the top surface of the fin structure. Nevertheless, regardless of the method adopted, similar caution should be exercised to prevent over etching of the STI dielectric material around the footing of the arch structure 130. In some embodiments, the surface of the STI feature is recessed downward by about 5 to about 10 nm (i.e., the overall height difference between the initial insulating surface 160 and the newly defined recessed insulating surface 160' is in the range from about 5 to about 10 nm). Accordingly, the height of the exposed lateral semiconductor fin surface 101 along the z-axis is about 5 to about 10 nm.

Figure 2C:
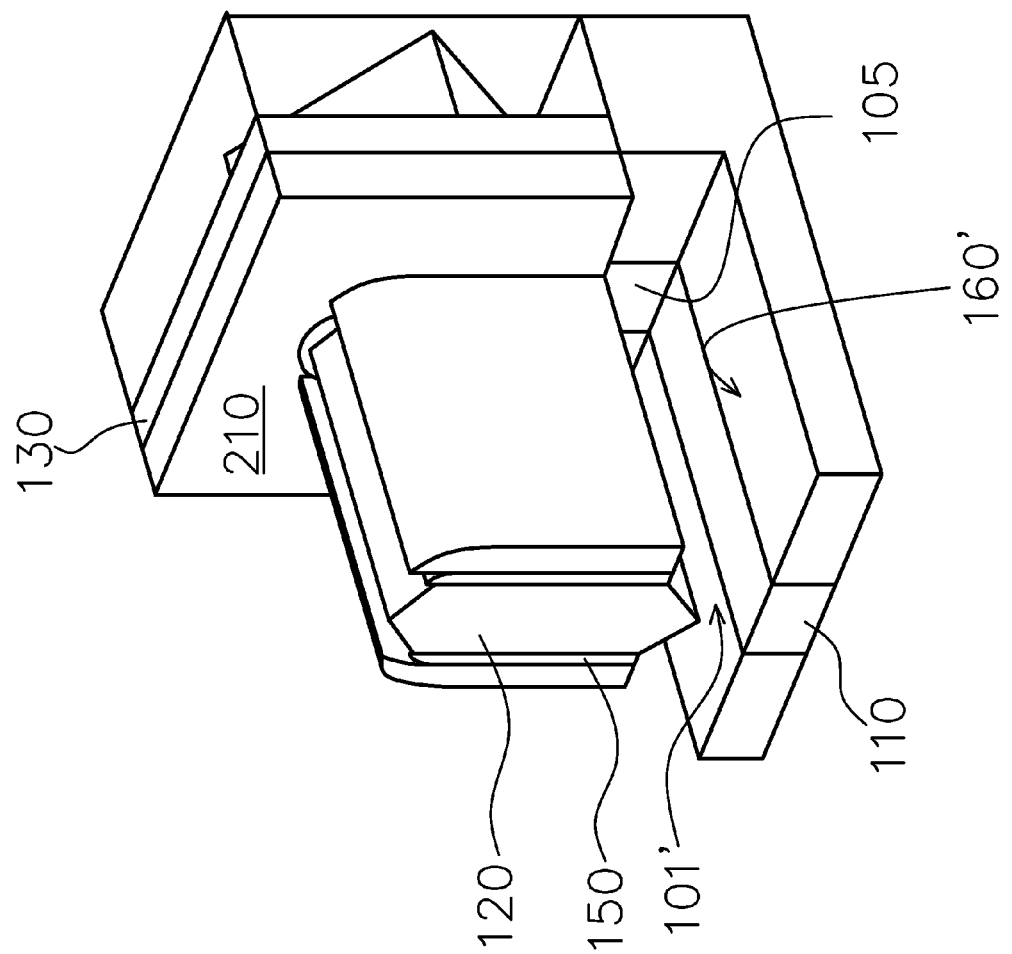

FIG. 2C illustrates an isometric view of a semiconductor structure at a local fin-root etching stage of fabrication in accordance with embodiments of the instant disclosure. Selective etching is performed to remove semiconductor material from the exposed fin portion (e.g., from the exposed lateral fin surface 101) for creating an intra-fin cavity 101' in the middle channel section of the fin structure 100. For example, an anisotropic wet etching process may be adopted, utilizing tetramethylammonium hydroxide ("TMAH") as etchant, to etch through the width (w) of the fin structure 100 at the centrally exposed region between the pair of etch-resisting arch structures 130. The directional selective etching generates the intra-fin cavity 101' in the channel portion of the fin structure 100 that extends transversely between the opposing arch structures 130, thereby structurally separating the middle channel section of the fin structure 100 into a suspended overhead portion 120 and an embedded root portion 110. Accordingly, the local fin structure reduction process through anisotropic wet etching creates a horizontally suspended nano-profiled wire/beam structure, which is used as a nano-channel for the semiconductor device.

Due to the crystallographic orientation dependency of the TMAH etching on silicon semiconductor material, the local reduction process of the fin structure may leave a downward-pointing angled structure on the bottom facing surface of the overhead portion 120 (as illustrated by the slightly pointed, downwardly extending bottom portion in the cross sectional profile of the overhead portion 120 in FIG. 2C). Likewise, the anisotropic fin etching process may create a similar but upward-pointed structure in the top facing part of the root portion 110. In addition, this nanowire creation process would yield a vertically interconnecting surface 105 in the fin structure 100 approximate the root portion of the arch structure 130, which extends substantially in the vertical direction between the overhead portion 120 and the root portion 110. It should be noted that, the process may consume part of the exposed semiconductor material at the top surface (tip portion) of the fin structure 100, as illustrated in FIG. 2C.

Figure 2D:
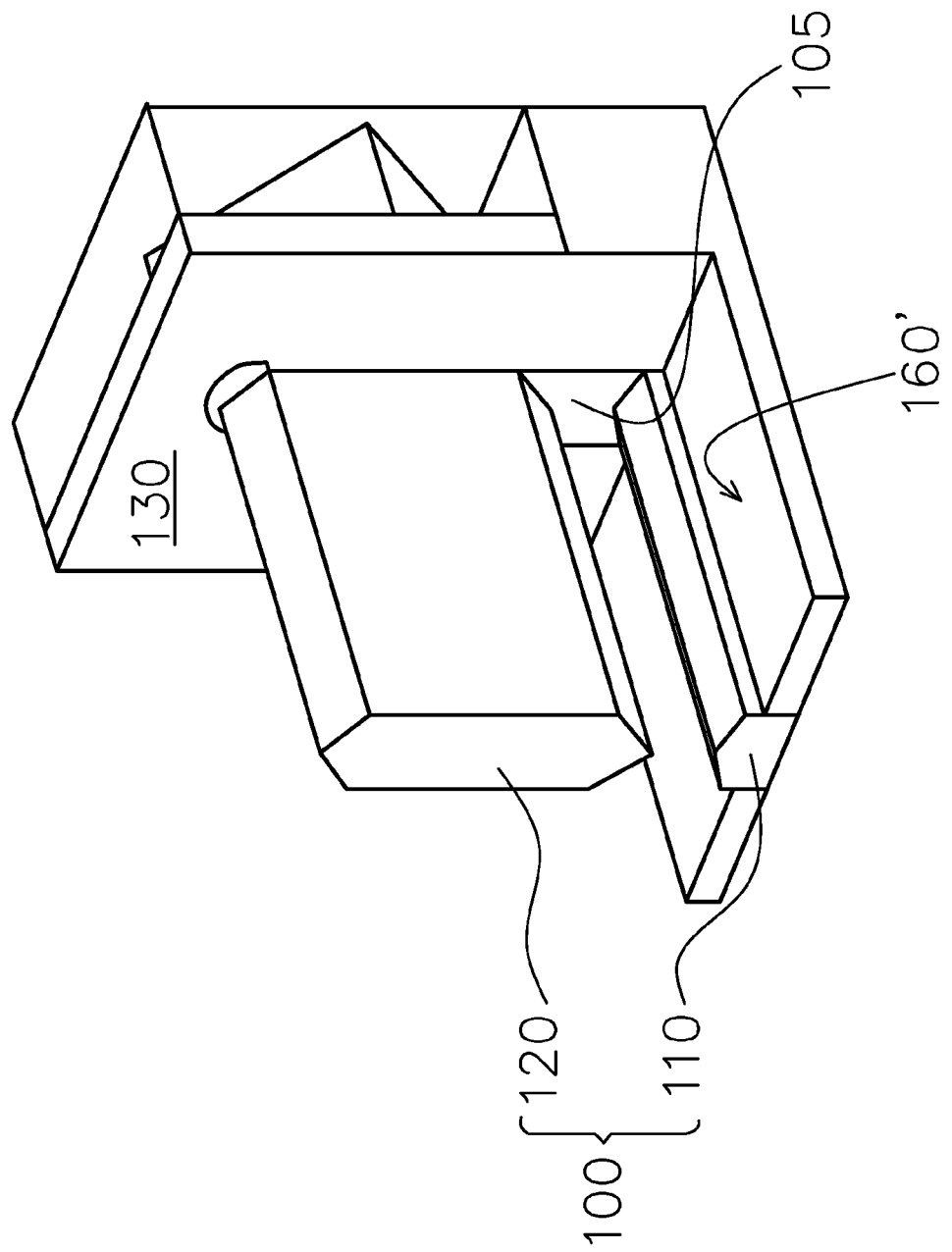

FIG. 2D illustrates an isometric view of a semiconductor structure at a spacer removal stage of fabrication in accordance with embodiments of the instant disclosure. A spacer removal process is performed to free the middle channel section of the semiconductor fin structure 100 from the covering dielectric spacers. The spacer removal process may comprise one or more spacer stripping steps, each of which being designated to remove a particular dielectric material. For instance, a nitride removal step may be carried out to remove the vertically extending nitride spacer 210 from the lateral surfaces of the arch structure 130 and the fin structure 100, followed by an oxide removal step to clean the oxide material of the dielectric spacer 150 off the outer surface of the semiconductor fin structure 100 (particularly from the overhead portion 120 thereof) in preparation for a subsequent gate stack formation process.

During the spacer removal process (particularly during the oxide removal step), the exposed surface of the STI feature may be further recessed, as is the exposed semiconductor surface of the fin structure 100. The recessed insulating surface 160' may be further reduced to a slightly lower level below the top surface of the root portion 110, allowing the upward-facing surface of the angled structure on the embedded root portion 110 to protrude there-from. Likewise, the overall cross sectional profile of the semiconductor fin structure 100 at the middle section thereof may be slightly reduced (and/or rounded), thus slightly extending the vertically interconnecting surface 105 between the overhead portion 120 and the root portion 110. Therefore, similar caution should be exercised to avoid over etching of the STI feature at the root portion of the arch structure 130 to prevent potential shorting problems.

FIG. 2E illustrates a cross-sectional view of a semiconductor structure at the spacer removal stage of fabrication in accordance with embodiments of the instant disclosure, as shown in FIG. 2D. Specifically, upon the removal of dielectric spacers from the middle channel section between the pair of opposing arch structures 130, the semiconductor surface of the fin structure 100 is revealed. The middle section of the fin structure 100 is provided with the intra-fin cavity 101' at the central portion thereof, physically separating the channel portion into the suspended overhead portion 120 on the top and the embedded yet protruding root portion 110 on the bottom. In some embodiments, the fin etching process yields a double deck semiconductor channel structure having a horizontally suspended upper channel (i.e., the overhead portion 120) having a width of about 7 to about 14 nm and a general height of about 7 to about 50 nm. In some embodiments, a semiconductor channel structure having more than two decks may be achieved through methods in accordance with the instant disclosure, provided that the initial height (h) of the fin structure is sufficient, and the placement interval of the intra-fin structure cavities is properly chosen.

FIG. 2F illustrates an isometric view of a semiconductor structure at a gate dielectric deposition stage of fabrication in accordance with embodiments of the instant disclosure. Specifically, a gate dielectric deposition process is performed to provide a gate dielectric layer 240 over the exposed semiconductor surface of the middle channel portion, which include the outer surface of the upper overhead portion 120, the protruding exposed top surface of the root portion 110, and the exposed vertically interconnecting surface 105 there-between. Suitable materials for the gate dielectric layer include, for example, silicon oxide, silicon nitride, silicon oxynitride, and high-k dielectrics. High-k dielectrics may comprise metal oxides, including, for example, oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The gate dielectric layer may be formed using a suitable process such as atomic layer deposition (ALD), chemical vapor deposition (CVD), physical vapor deposition (PVD), thermal oxidation, UV-ozone oxidation, or combinations thereof. The gate dielectric layer may further comprise an interfacial layer (not shown) to reduce damage between the gate dielectric layer and the contact surface of the channel structure. The interfacial layer may comprise silicon oxide. In the instant example, a gate dielectric layer 240 comprising high-K dielectric material is adopted in conjunction with a metal gate, which generally offers superior electrical performance over conventional polysilicon materials. The coverage of gate dielectric layer over the vertically interconnecting surface 105 is of particular importance for preventing potential shorting between gate and the source/drain.

Figure 2G:
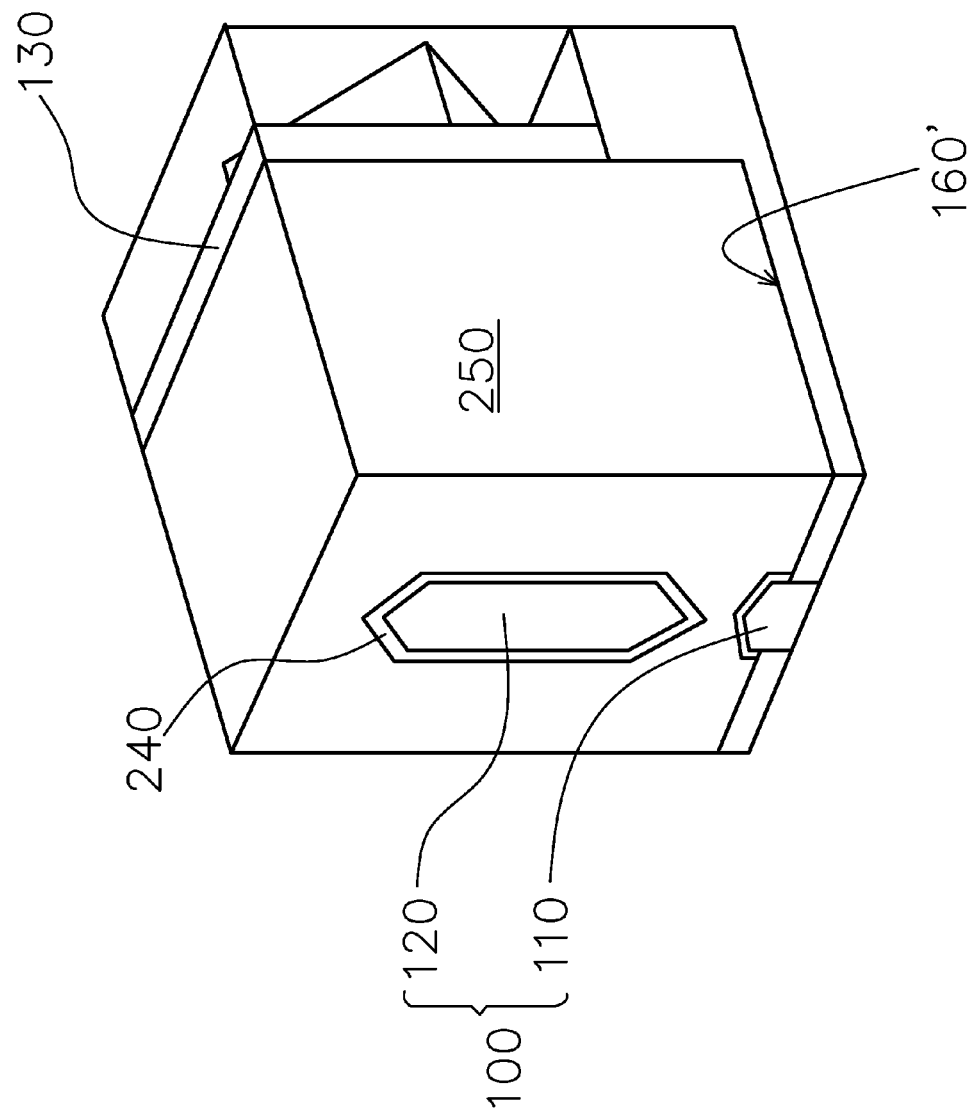

FIG. 2G illustrates an isometric view of a semiconductor structure at a gate material deposition stage of fabrication in accordance with embodiments of the instant disclosure. Specifically, a gate deposition step takes place toward the end of the GAA formation process, in which one or more suitable gate material is disposed over the fin structure 100 at the middle section thereof, thereby providing an all-around gate structure 250 surrounding a cross section of the overhead portion 120 as well as capping over the protruding portion of the root portion 110. In some embodiments, the gate material substantially fills the structural voids above the recessed insulating surface 160' at the middle section of the fin structure 100 between the arch structures 130. The gate structure 250 may be a single layer or multilayer structure. The gate stricture may comprise polysilicon. Further, the gate structure may be doped polysilicon with uniform or non-uniform doping. In one embodiment a metal gate with high-K dielectric is adopted. The gate structure may comprise a metal material such as Al, Cu, W, Ti, Ta, TiN, TiAl, TiAlN, TaN, NiSi, CoSi, other conductive materials with a work function compatible with the substrate material, or combinations thereof.

The gate structure may optionally include a work function layer, e.g., a conductive layer with proper work function or tuned to the proper work function. The work function layer may include tantalum, tantalum nitride, nickel silicide, cobalt silicide, TiN, WN, TiAl, TiAlN, TaCN, TaC, TaSiN, and other suitable materials, or combinations thereof. The deposition of the gate material may be implemented using a suitable process such as ALD, CVD, PVD, plating, or combinations thereof. While metal gates generally offer superior performance over conventional gates made of doped semiconductor materials, the metal filling materials thereof are generally more susceptible to heat damage. Due to the limited thermal budget possessed by the metal gate materials, the metal gate replacement process usually takes place toward the final stages of the fabrication procedure.

Referring again to FIG. 2G, the gate structure 250 has a cross sectional profile that defines a channel passage pattern substantially resembling an exclamation mark, which accommodates the suspended nano-channel structure (i.e., the overhead portion 120) at the top and the protruding miniature fin structure (i.e., the upper part of the root portion 110) at the bottom. Such arrangement may offer further performance advantages over the conventional horizontal gate-all-around devices that adopt only the above-plane nanowire channel arrangement. Particularly, with proper source/drain junction adjustments (e.g., a deeper depth of doping/epitaxial layer), the protruding head of the embedded root portion 110 may be utilized to serve as a miniature fin channel in conjunction with the all-surrounded nanowire channel suspended overhead, thereby allowing an increased amount of on-current flow. Further, as the gate structure 250 simultaneously surrounds the top suspended channel and caps the bottom protruding fin channel, outstanding gate controllability may be achieved. The effective gate control arrangement may enable further down scaling of the gate node length without giving into the short channel effect (SCE). In some embodiments, a gate node of about 5 to 100 nm may be achieved.

In some embodiments, further measures may be taken to enhance device performance, particularly through the reduction of parasitic capacitance that may reside in the bottom channel region of the semiconductor structure.

Figure 3A:
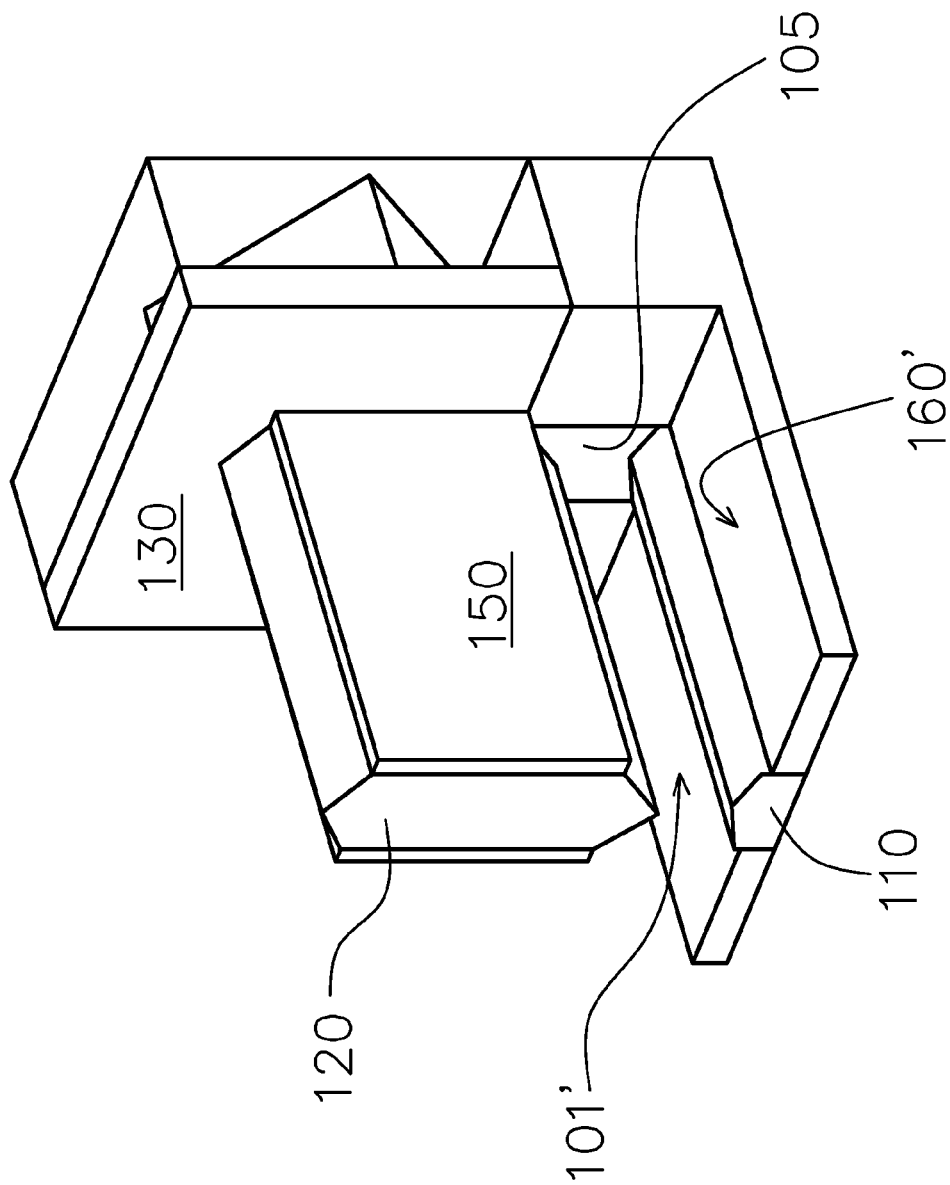
FIGS. 3A-F illustrate isometric views of a semiconductor structure at various stages of fabrication in accordance with embodiments of the instant disclosure.

FIG. 3A illustrates an isometric view of a semiconductor structure prior to a replacement gate deposition stage of fabrication in accordance with embodiments of the instant disclosure. Specifically, the structure shown in FIG. 3A may be obtained from the dielectric removal process as illustrated and discussed in FIG. 2D, where a first spacer stripping step is carried out to remove the vertically extending nitride spacer 210 from the lateral surfaces of the arch structure 130 and the fin structure 100, thereby leaving substantially only the lateral-covering portion of the oxide spacer 150 on the side wall of the overhead portion 120 of the fin structure 100. The vertically interconnecting surface 105 between the upper overhead portion 120 and the lower root portion 110 is also exposed.

Figure 3B:
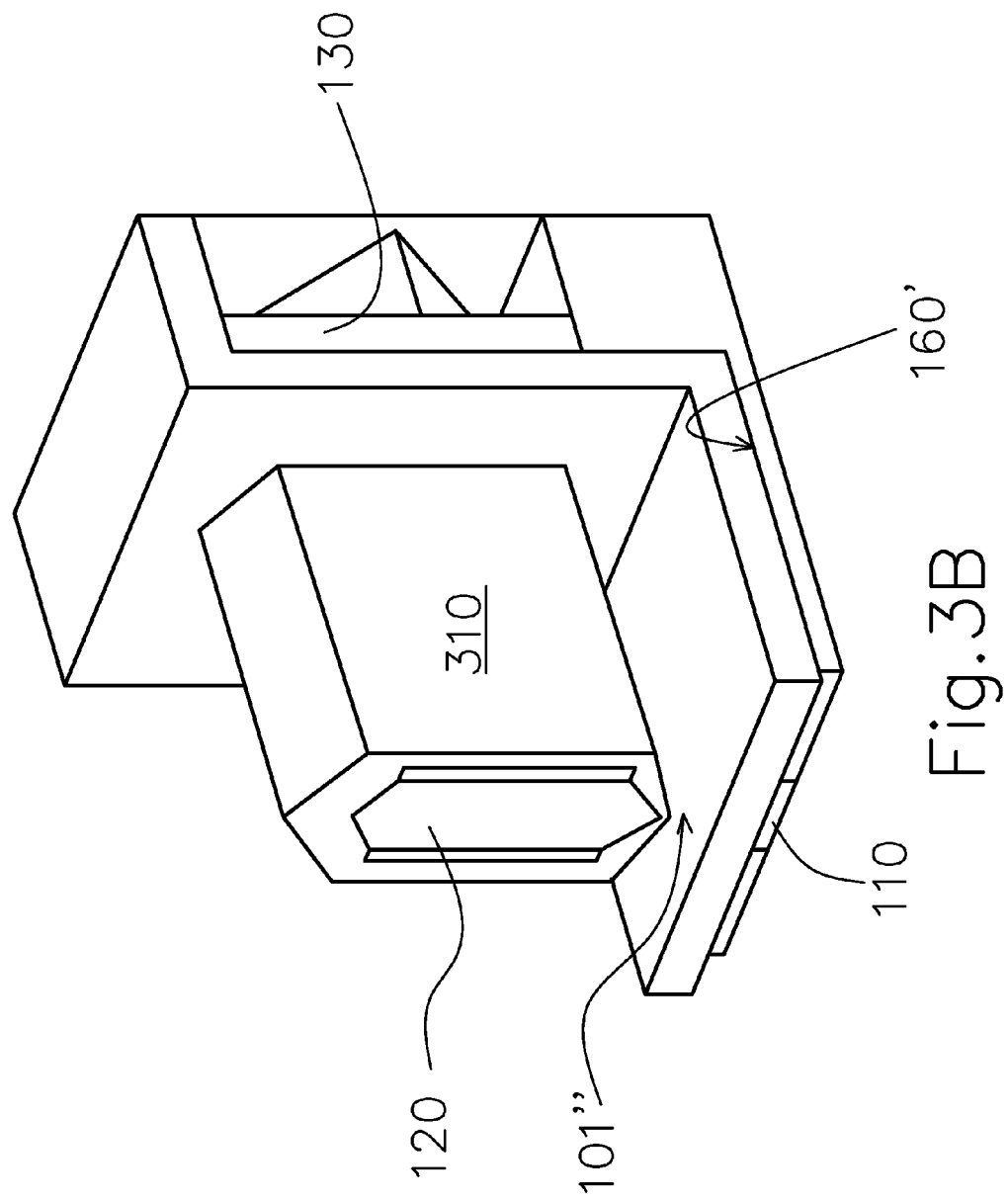

FIG. 3B illustrates an isometric view of a semiconductor structure at a spacer deposition stage of fabrication in accordance with embodiments of the instant disclosure A spacer deposition step is carried out to provide a blanket dielectric layer 310 of a first insulating material on the semiconductor structure shown in FIG. 3A. The coverage of the blanket spacer layer 310 substantially includes the suspended overhead portion 120, the root portion 110, and the surrounding surface 160' of the embedding STI feature, the lateral surface on and under the arch structure 130 (as well as the exposed vertically extending interconnecting surface 105 (now covered and not visible in the figure), and the top surface of the arch structure 130. Suitable techniques, such as CVD, PVD, ALD, may be used to form the spacer layer 310. Suitable material for the spacer layer 310 may include SiN and SiON. Particularly, the blanket layer 310 that formed on the bottom surface of the semiconductor structure covers the root portion 110 of the fin structure 100 and the surrounding insulating surface 160' without filling the space under the suspended overhead portion 120 (e.g., without filling the intra-fin cavity 101'). Thus, there remains a gap 101" of suitable distance between the blanket layer 130 covering the downward-facing surface of the overhead portion 120 and that covering the upward-facing surface of the root portion 110.

Figure 3C:
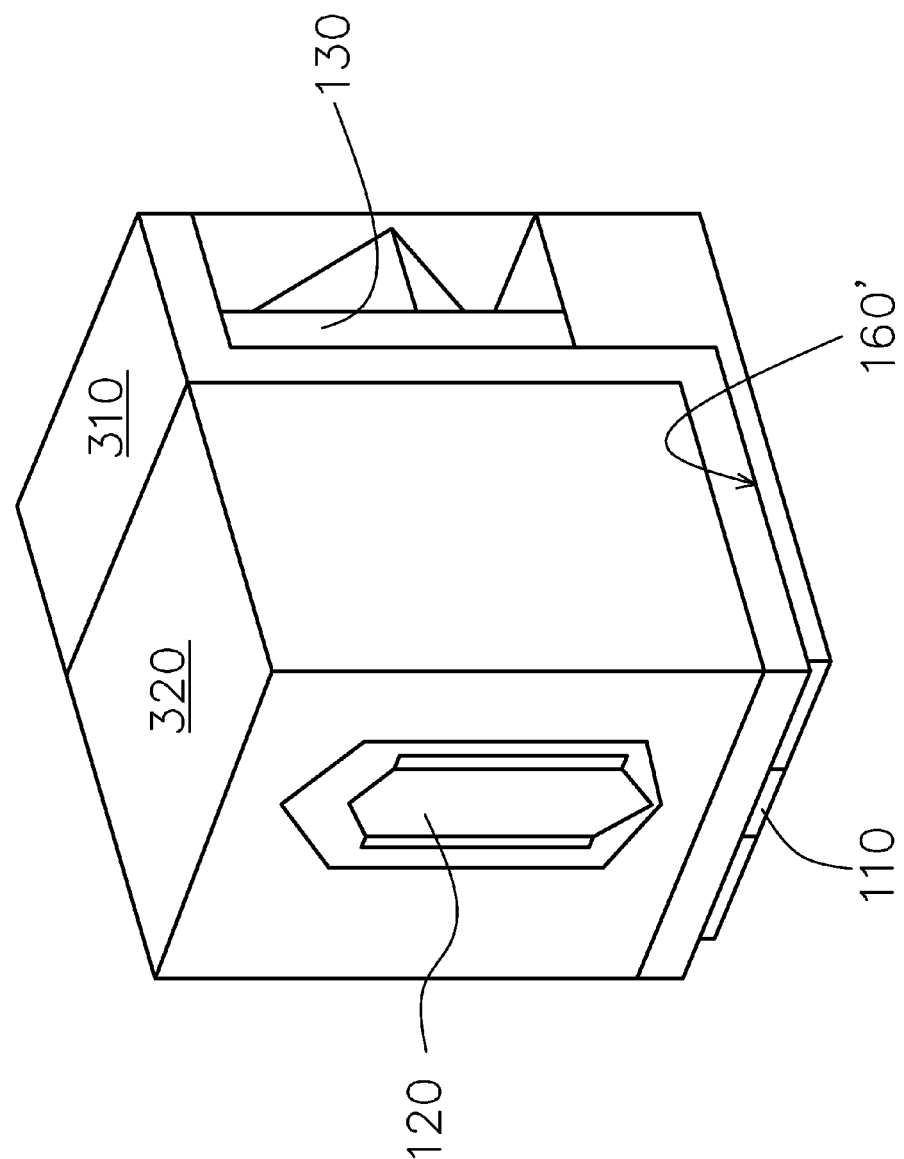

FIG. 3C illustrates an isometric view of a semiconductor structure at a dielectric deposition stage of fabrication in accordance with embodiments of the instant disclosure. A dielectric deposition step is carried out to dispose a second dielectric material on the spacer layer 310, thus forming an interlayer dielectric structure 320. Specifically, the interlayer dielectric structure 320 substantially fills the structural voids at the middle section of the fin structure between the arch structures 130, and substantially covers the nitride-coated insulating surface 160', root portion 110, and overhead portion 120. The interlayer structure 320 may comprise oxide material, such as $SiO_2$, and may be formed by using suitable conventional techniques. Upon the deposition of the interlayer dielectric 320, the gap between the suspended overhead structure 120 and the root structure 110 is substantially filled. A planarization process (e.g., chemical-mechanical planarization/CMP) may be performed to trim the respective top surfaces of the spacer layer 310 and the interlayer structure 320 to a substantially leveled condition (i.e., flush with each other).

A dielectric recessing process is subsequently performed to free the suspended semiconductor channel structure (i.e., the overhead portion 120) from the surrounding dielectric materials, as well as forming an insulating stack structure on the embedded root portion 110 and under the suspended overhead portion 120. The process may comprise one or more spacer stripping step, each of which being designated to remove a particular dielectric material, discussed in further detail as follows.

Figure 3D:
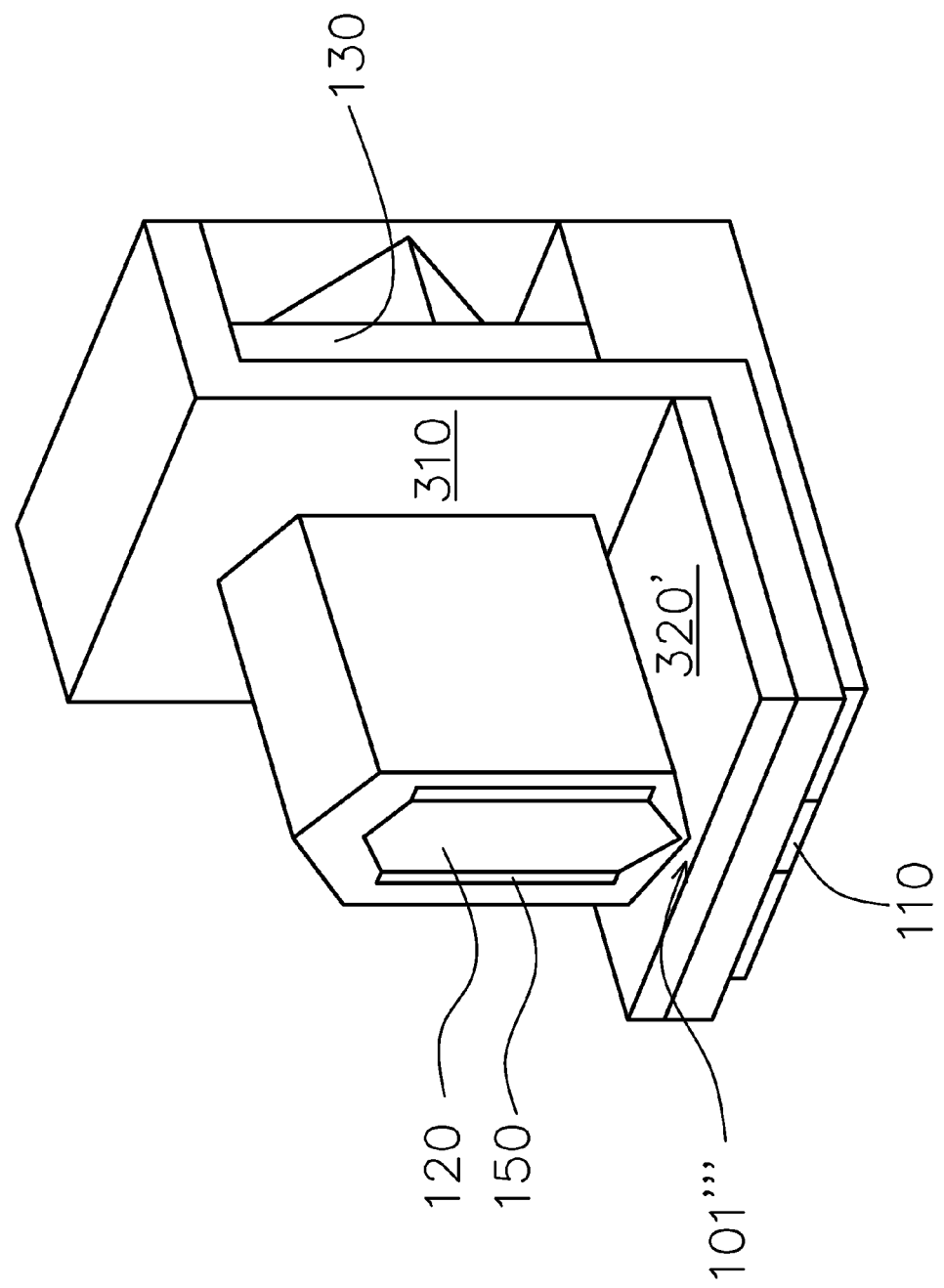

FIG. 3D illustrates an isometric view of a semiconductor structure at a first dielectric recessing stage of fabrication in accordance with embodiments of the instant disclosure. Specifically, a first recessing step is performed to bring the interlayer dielectric 320 down to a level below the spacer-covered overhead portion 120. A directional etching technique having sufficiently high selectivity to the dielectric material of the interlayer structure 320 (e.g., $SiO_2$) may be employed to provide such a result. A further-narrowed gap 101''' of predetermined height may thus be formed between a downward-facing spacer surface on the lower portion the overhead structure 120 and an upper surface 320' of the now recessed interlayer structure 320.

Figure 3E:
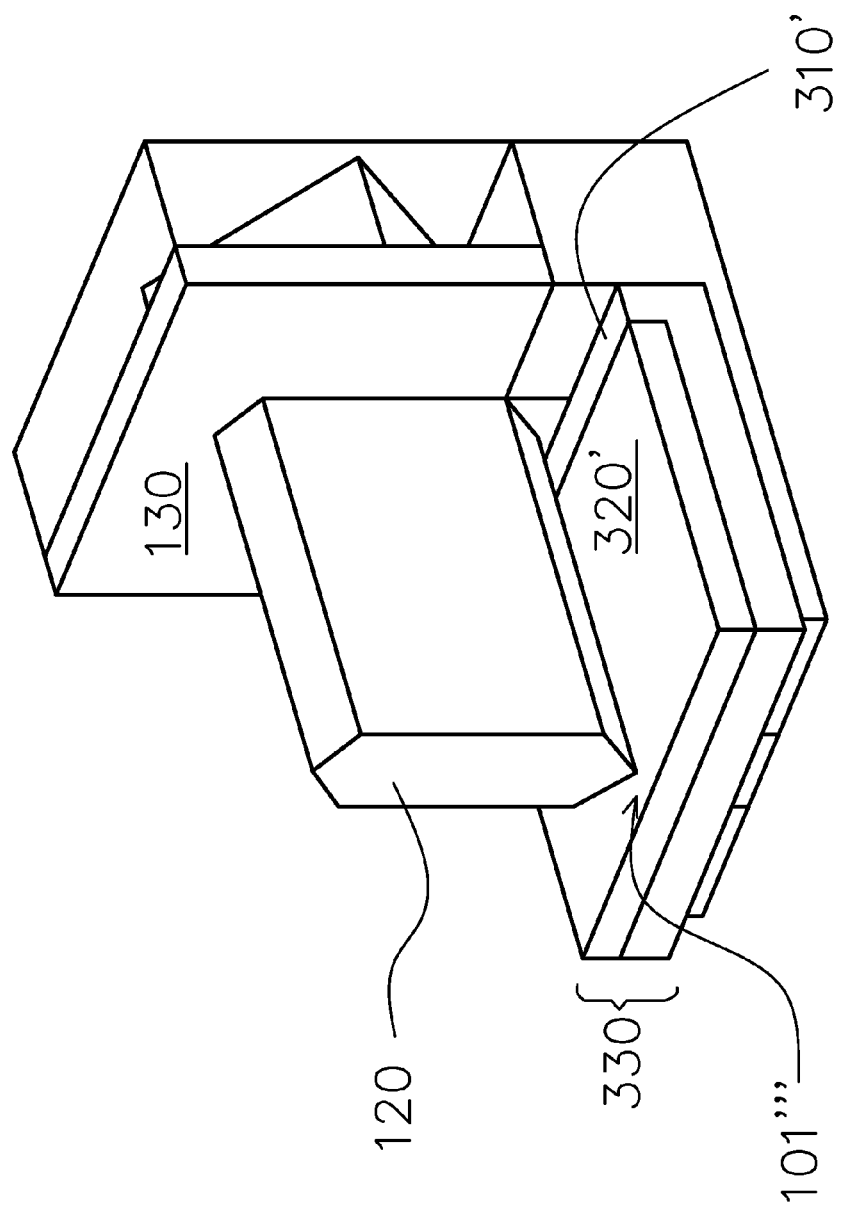

FIG. 3E illustrates an isometric view of a semiconductor structure at a second dielectric recessing stage of fabrication in accordance with embodiments of the instant disclosure. Specifically, in a similar fashion, a second recessing step is carried out to strip the spacer layer 310 off the semiconductor surface of the suspended overhead structure 120, as well as bringing the spacer layer 310 down to a substantially identical level as the recessed interlayer structure 320', thereby forming an insulating stack structure 330 between the overhead structure 120 and the now-buried root structure 110. Particularly, absent the spacer layer 310, a slightly wider gap 101'''' is formed between a lower semiconductor surface of the overhead portion 120 and the upper surface 320' of the insulating stack structure 330.

Figure 3F:
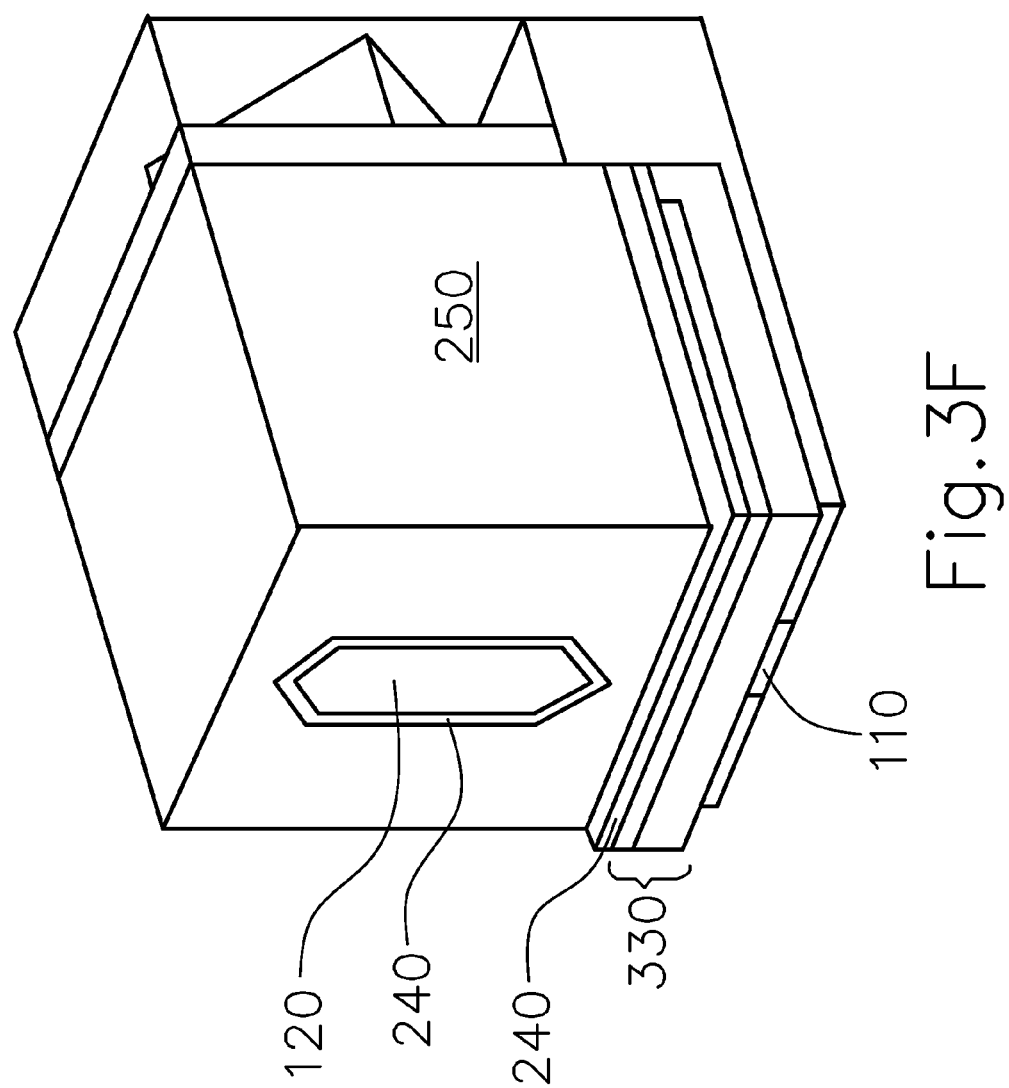

FIG. 3F illustrates an isometric view of a semiconductor structure at a gate stack formation stage of fabrication in accordance with embodiments of the instant disclosure. Specifically, upon the formation of the insulating stack structure 330 between the overhead structure 120 and the buried root structure 110, a gate stack formation step may take place to provide a GAA gate stack over the suspended semiconductor channel structure. Similar to that discussed previously, a gate dielectric layer 240 is coveringly formed on the exposed semiconductor surface of the overhead portion 120, as well as the exposed portion of the vertically interconnecting surface 105 (not visible in the figure) and a top surface of the insulating stack structure 330. A suitable gate material is then disposed over the fin structure 100 at the middle section thereof, thereby providing an all-around gate structure 250 surrounding a cross section of the overhead portion 120. The gate material may substantially fill the structural voids above the insulating stack structure 330 at the middle section of the fin structure 100 between the arch structures 130, as shown in the instant figure.

With the insertion of the insulating stack structure 330 and proper adjustments of the source/drain junction (e.g., a shallower depth of doping/epitaxial layer), the semiconductor structure in accordance with embodiments of the instant disclosure may be tuned to substantially eliminate the undesirable parasitic capacitance. However, in this case, the embedded root portion 110 is no longer utilized as a complementary carrier channel. Nevertheless, the effective gate control ability provided by the all-around gate 250 may enable further down scaling of the gate node length without giving in to the short channel effect (SCE).

In some embodiments, alternative measures may be taken to achieve the reduction of parasitic capacitance that may reside in the bottom channel region of the semiconductor structure.

Figure 4A:
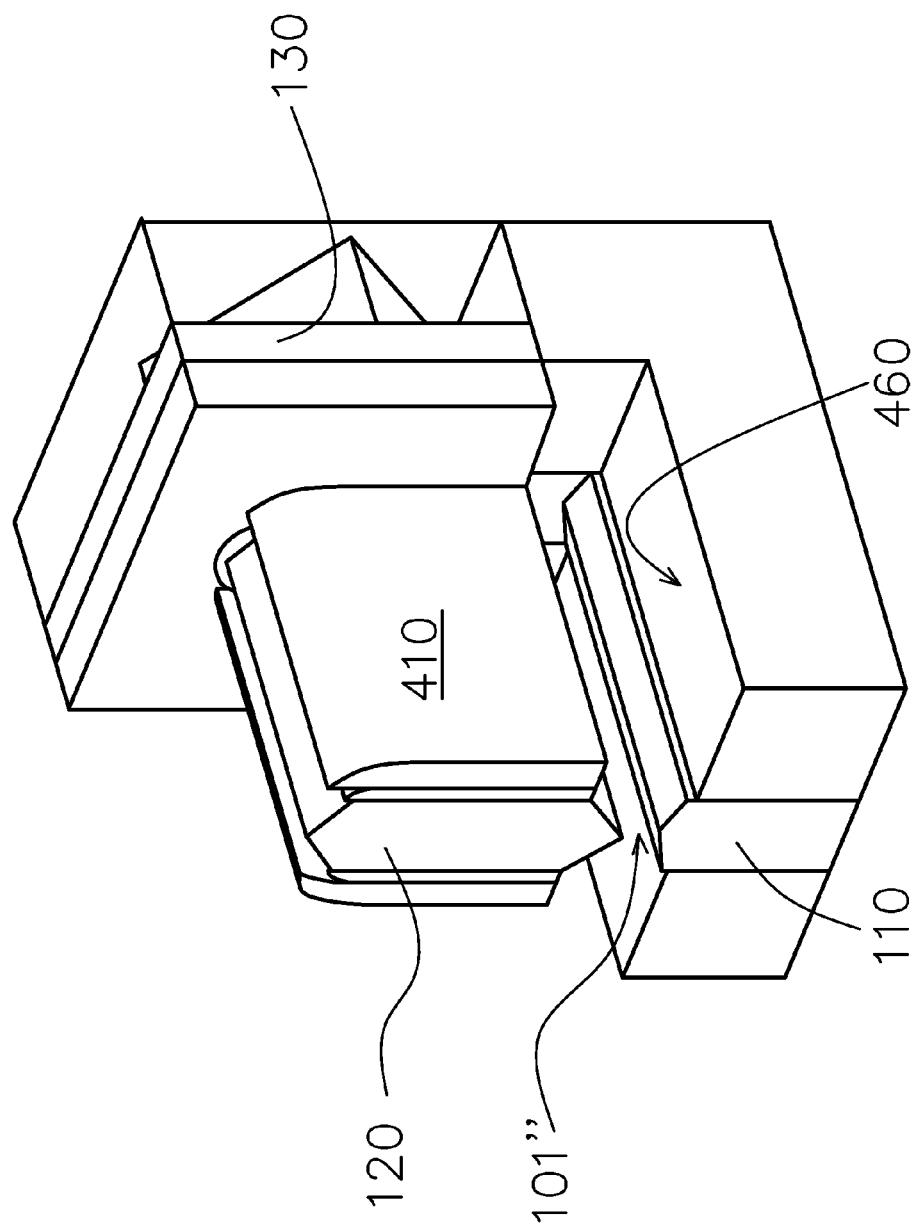
FIGS. 4A-H illustrate isometric views of a semiconductor structure at various stages of fabrication in accordance with embodiments of the instant disclosure.

FIG. 4A illustrates an isometric view of a semiconductor structure prior to a replacement gate deposition stage of fabrication in accordance with embodiments of the instant disclosure. The structure shown in FIG. 4A may be obtained from the selective etching process of the exposed fin root structure as depicted in the discussion for FIG. 2C, where a transversely extending through-cavity (i.e., the intra-fin cavity 101') is generated to structurally separate the middle channel section of the fin structure 100 into the suspended overhead portion 120 and the embedded root portion 110. The embedding STI feature around the instantly exposed root portion 110 comprises an initial insulating surface 460.

Figure 4B:
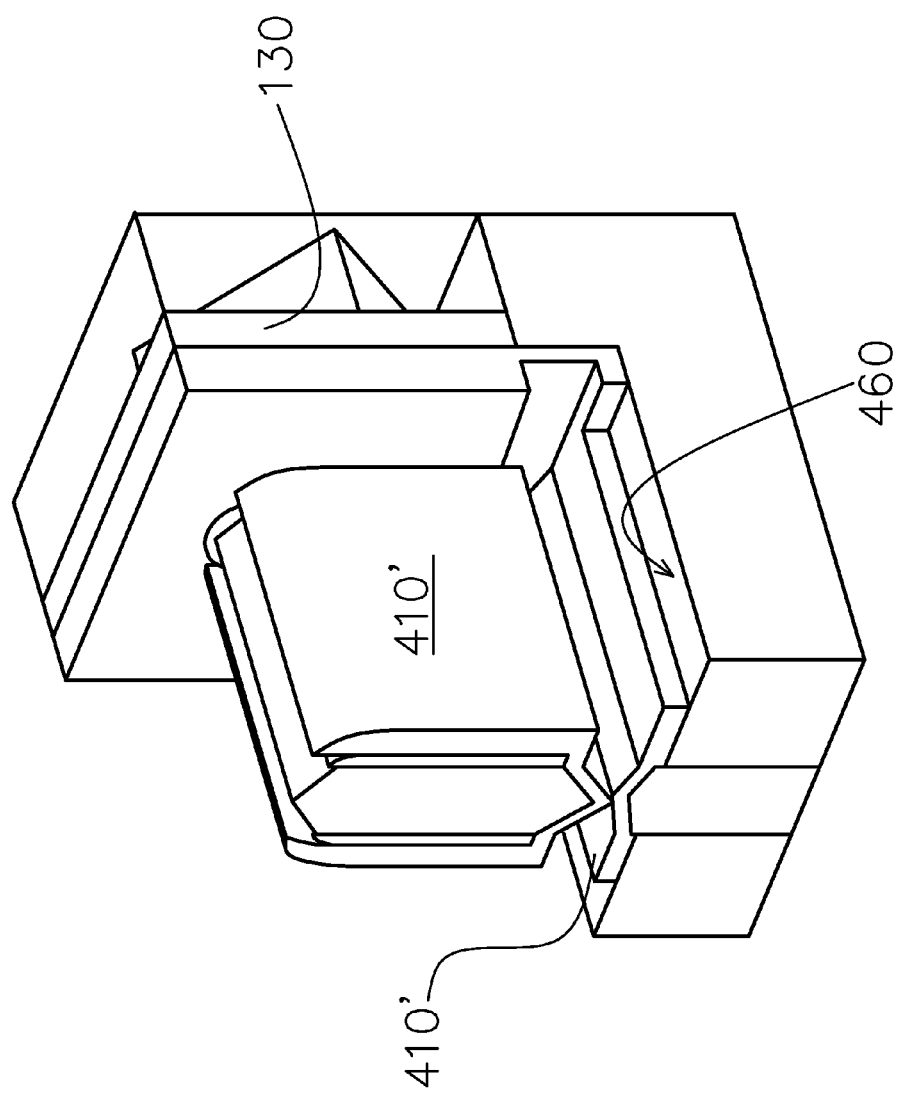
Figure 4C:
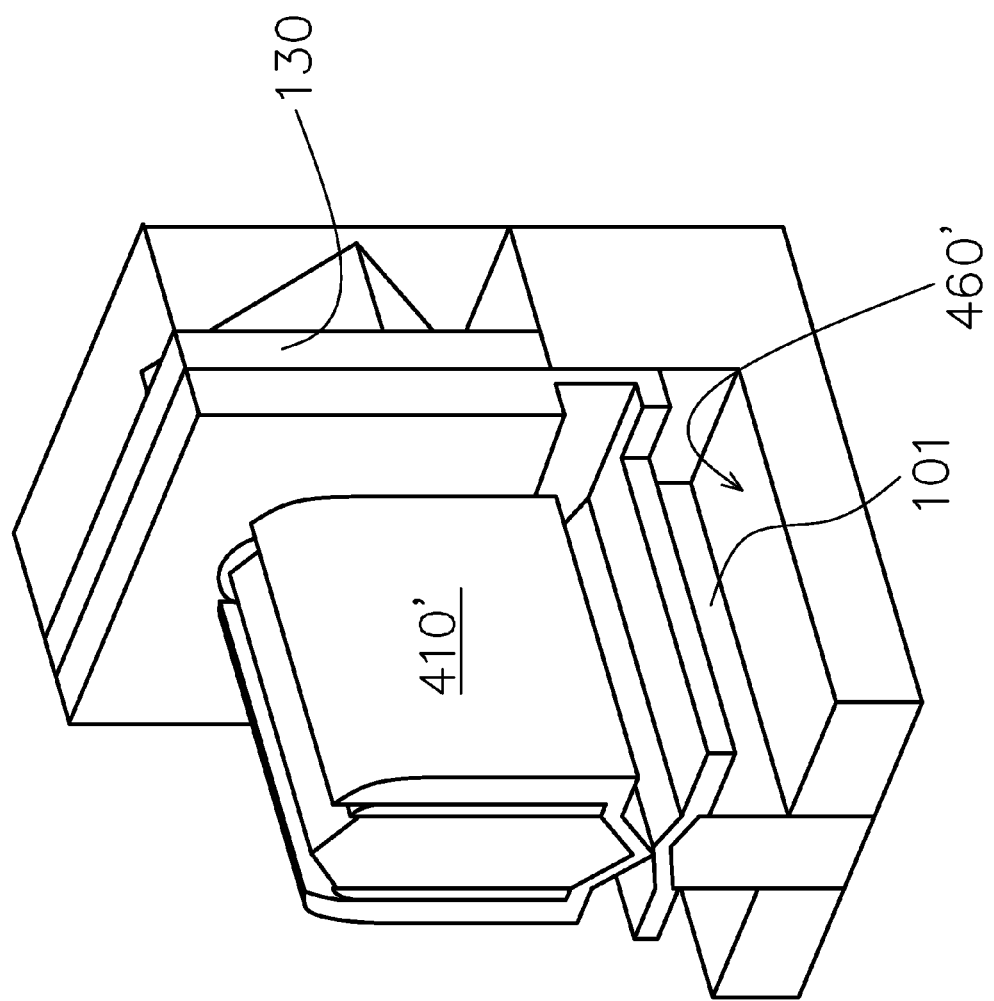
Figure 4D:
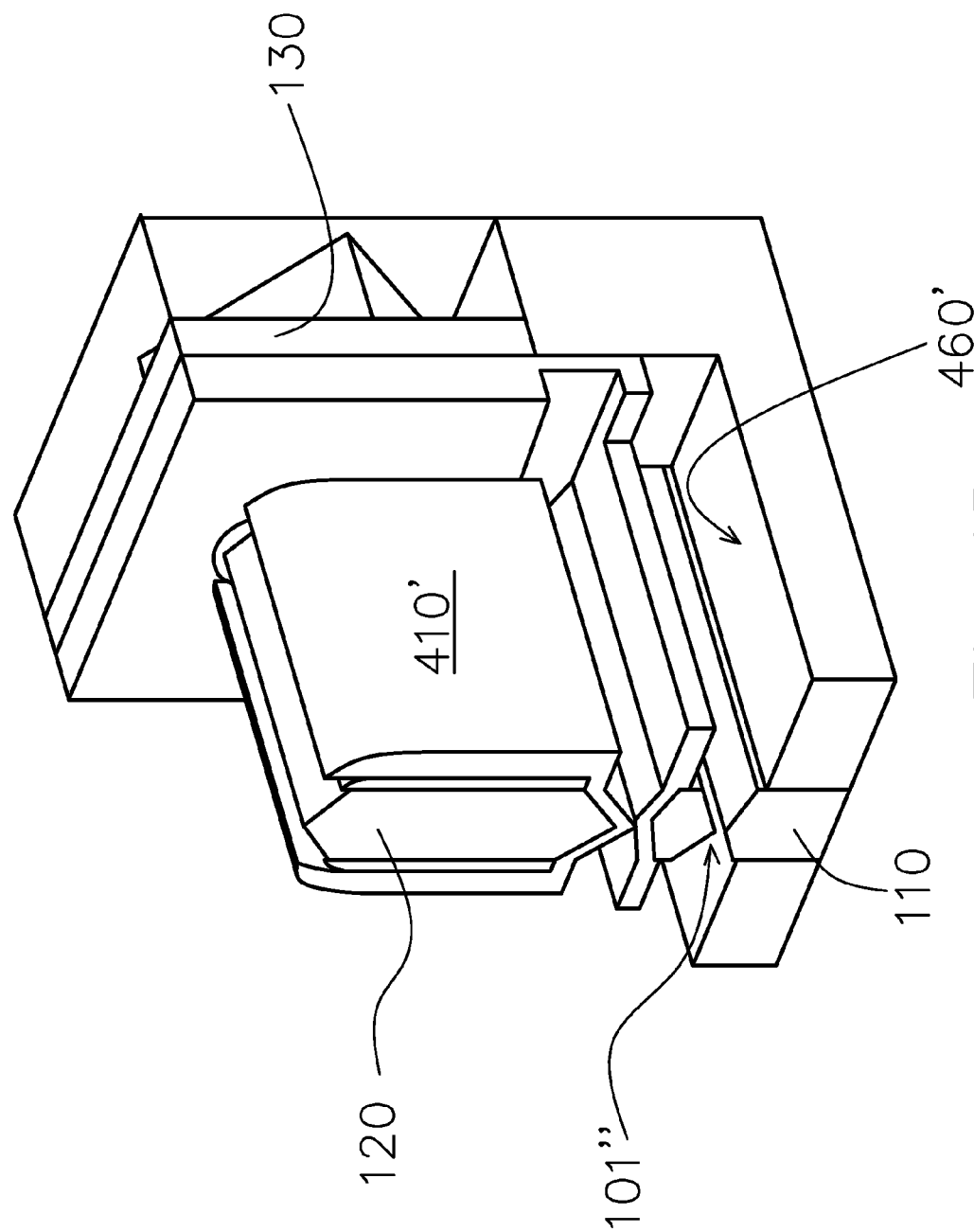

FIG. 4B to 4D illustrate isometric views of a semiconductor structure at various stages of a fin-root recessing process in accordance with embodiments of the instant disclosure. Particularly, a series of spacer deposition step, STI recessing step, and fin root etching step comparable to that discussed and illustrated in FIGS. 2A to 2C are repeated, further pushing the insulating surface 460 of the STI feature and the upward-facing surface of the embedded root portion 110 downward, thereby providing an increased separation distance between the suspended overhead portion 120 and the further recessed root portion 110.

Specifically, FIG. 4B shows the implementation of an iterated spacer deposition process, where an additional spacer material comparable to that of the spacer layer 410 (e.g., nitride material) is further disposed over the middle channel region of the semiconductor structure between the arch structures 130. The further deposition of spacer material thickens the existing vertically extending spacer layer 410, as well as creating additional spacer coverage on the upward-facing surfaces at regions under the suspended overhead portion 120 and the lateral surfaces under the root portion of the arch structure 130, thereby forming an enlarged spacer layer 410'. The enlarged spacer layer 410' substantially covers the originally exposed upward-facing surface of the root portion 110.

Referring to FIG. 4C. An iterated STI recessing step is then performed to exposed a deeper lateral surface of the originally embedded root portion 110. As the further STI recessing step may adopt comparable techniques and conditions previously set forth in the discussion for FIG. 2B, the detail thereof will be omitted for brevity. The iterated STI recessing step consumes additional oxide material in the STI feature, thereby yielding a further recessed insulating surface 460'. Accordingly, a deeper portion of the originally buried lateral fin root surface 101 is exposed.

Referring to FIG. 4D. An iterated fin root etching step is subsequently performed on the newly exposed lateral surface 101 at a deeper part of the root portion 110 to reduce the upward-facing surface of the root portion 110 further downward, thereby widening the vertical separation distance between the overhead portion 120 and the root portion 110. Specifically, in a similar fashion, the further fin root etching step creates an transversely extending lateral cavity 101" at the region of the exposed lateral surface 101. As the further fin root etching step may adopt comparable techniques and conditions as that depicted previously in the discussion for FIG. 2C, the detail thereof will be omitted for brevity. However, the lateral cavity 101" generated in the instant step need not penetrate through the entire width of the fin root structure as required by the original fin etching step depicted in the discussion for FIG. 2C. In the case where the lateral cavity 101" does not fully penetrate through the entire width of the fin root structure, the lateral cavity 101" from the instant root etching step would nevertheless generate transversely extending notches (indentation) on the exposed lateral side walls of the fin root structure, thus locally increasing the surface area of the exposed semiconductor material in preparation for a subsequent fin root oxidation process. The locally increased surface exposure of the semiconductor fin material may enhance the effectiveness of the following oxidation process.

The iteration of the abovementioned steps may be performed a plurality of times, depending on the specific separation between the top overhead portion 120 and the bottom root portion 110 a particular application wishes to achieve.

Figure 4E:
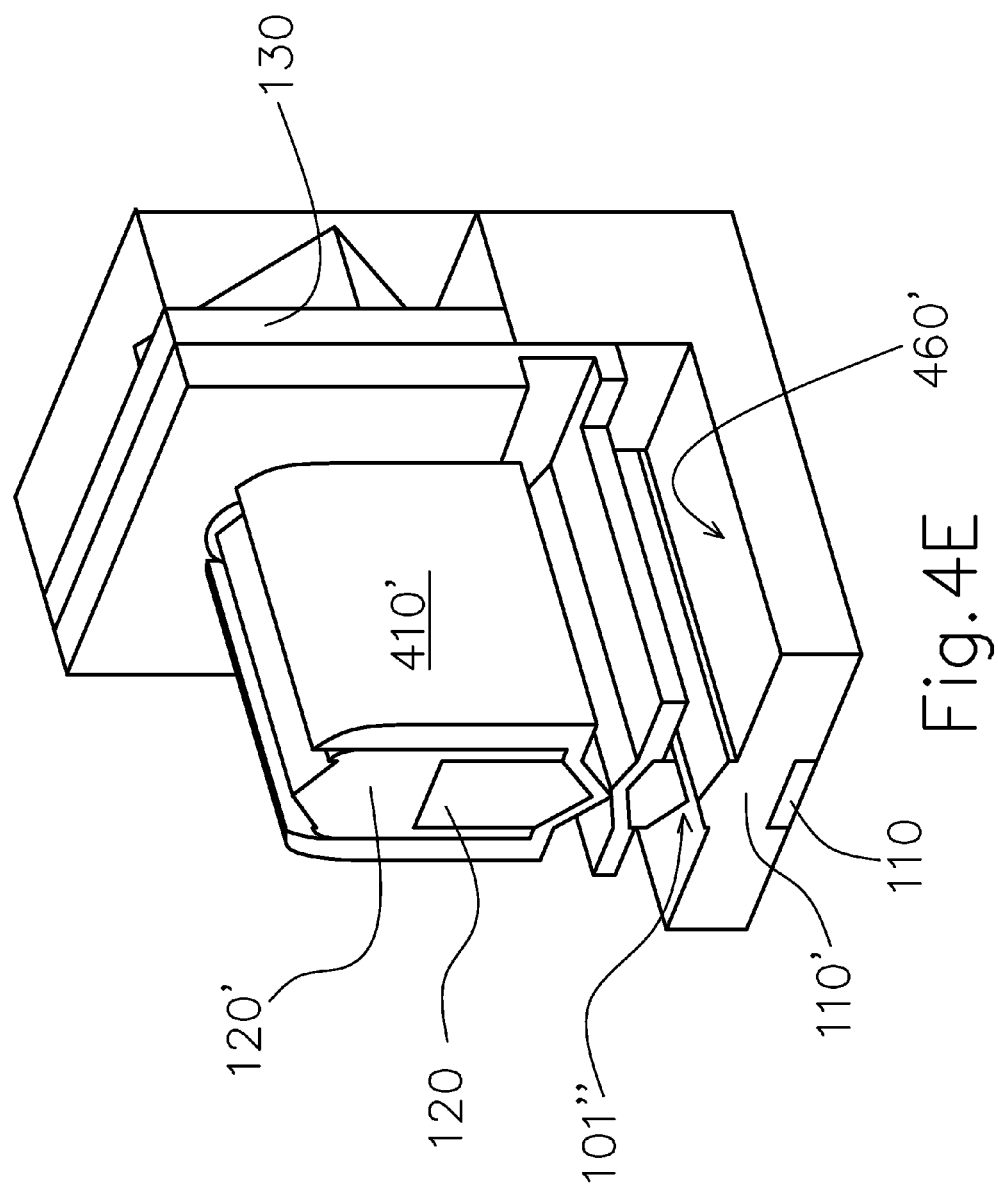

FIG. 4E illustrates an isometric view of a semiconductor structure at a fin root oxidation stage of fabrication in accordance with embodiments of the instant disclosure. Specifically, a fin root oxidation step, such as a thermal oxidation process, is carried out to oxidize the exposed semiconductor material at the upper (e.g., tip) portion 110' of the root structure 110. The oxidation process would locally convert the semiconductor material around the lateral cavity 101" in to oxides (e.g., $SiO_2$). Particularly, the semiconductor material at the top portion 110' of the root structure 110, as well as the exposed material under the enlarged spacer layer 410', would be converted into oxide/dielectric materials, thus further burying the semiconductor fin root portion downward (i.e., away from the suspended overhead channel structure 120). As the lower root portion 110 of the semiconductor fin structure 100 is kept further away from the upper suspended overhead portion 120, the likelihood of undesirable parasitic capacitance at the fin root region may be reduced.

Practically, the top exposed portion 120' of the suspended overhead structure 120 may inevitably be oxidized during the fin root oxidation step, resulting in a decreased cross sectional profile in the semiconductor channel.

Figure 4F:
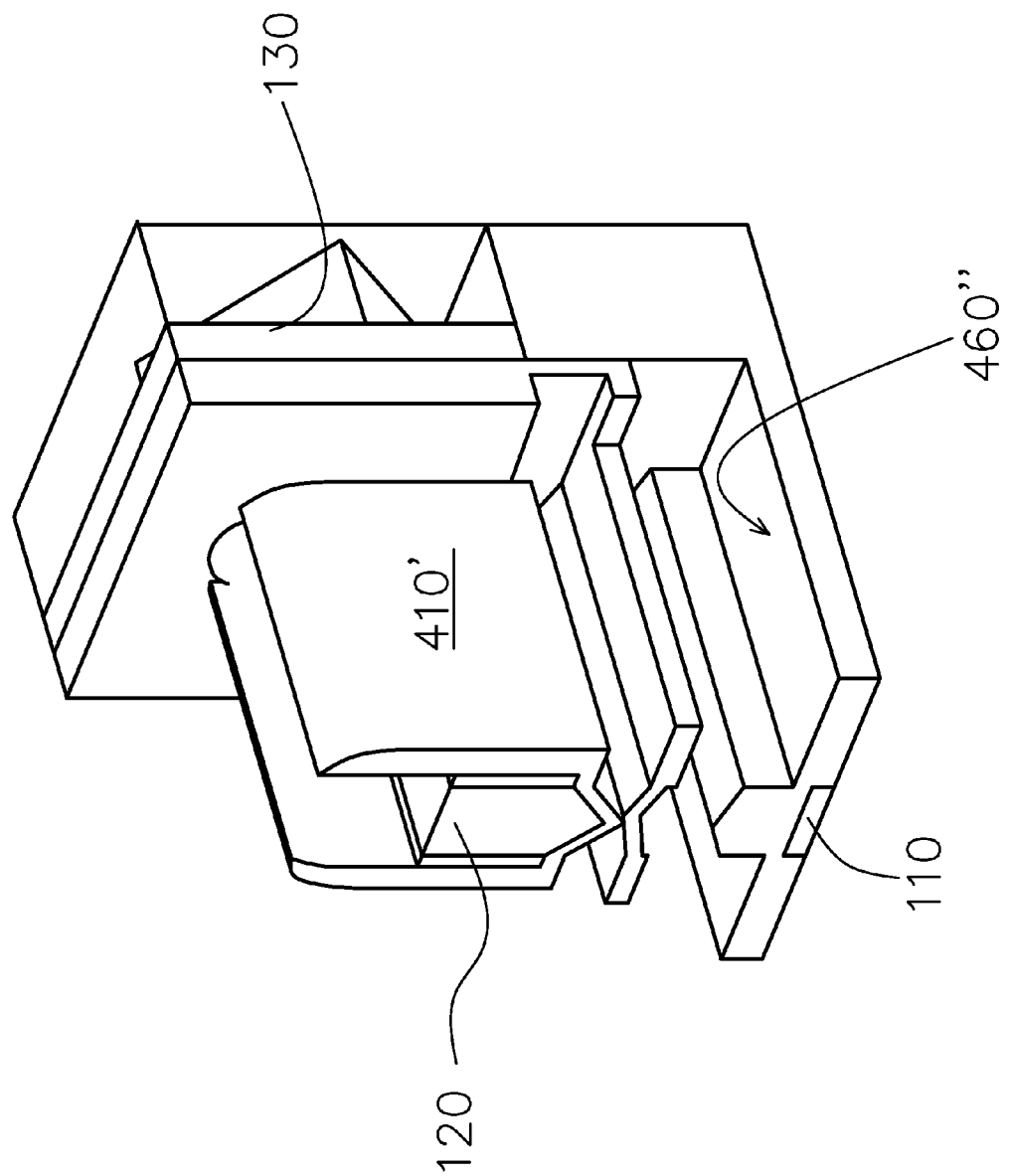

FIG. 4F illustrates an isometric view of a semiconductor structure at a STI recessing stage of fabrication in accordance with embodiments of the instant disclosure. Specifically, a further STI recessing step is performed, in which an directional etching technique is utilized to selectively remove the STI dielectric material in the middle section of the semiconductor structure between the arch structures 130, resulting in a further recessed insulating surface 460". Please note that, the oxidized top portion 120' of the overhead channel structure 120 may also be removed during the process, leaving the overhead structure with a reduced cross sectional profile, as illustrated in the instant figure.

Figure 4G:
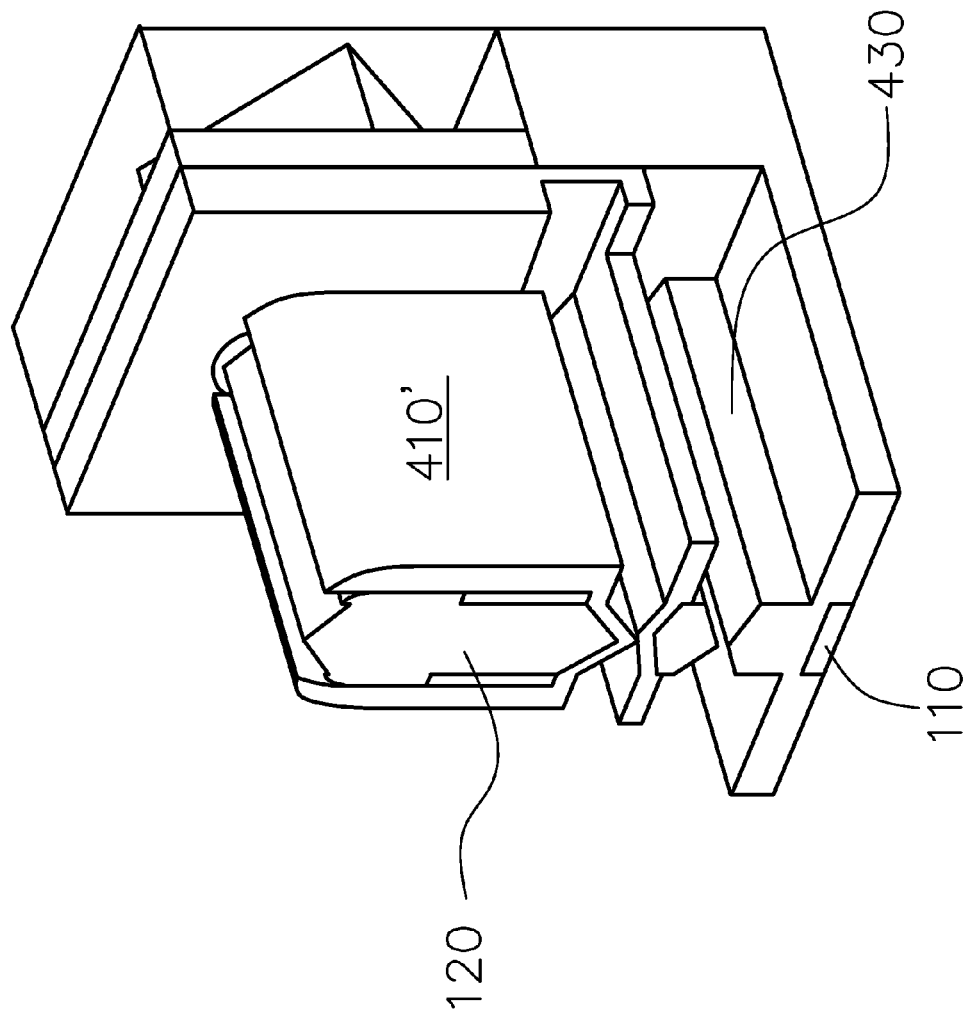

FIG. 4G illustrates an isometric view of a semiconductor structure at a channel re-growth stage of fabrication in accordance with embodiments of the instant disclosure. As a reduced channel cross section generally adversely affects the device performance, an optional channel re-growth process may be implemented to compensate for the loss of channel profile during the fin root oxidation step. Specifically, an optional channel re-growing process is performed, utilizing the remaining enlarged spacer layer 410' as a molding template, to epitaxially grow the semiconductor material of the suspended channel back to a desirable height, thus yielding the reconstructed overhead structure 120. Moreover, as a result of the fin root etching and the fin root oxidation processes, an insulating structure 430 is formed on the semiconductor material of the root structure 110 and under the suspended overhead structure 120.

Figure 4H:
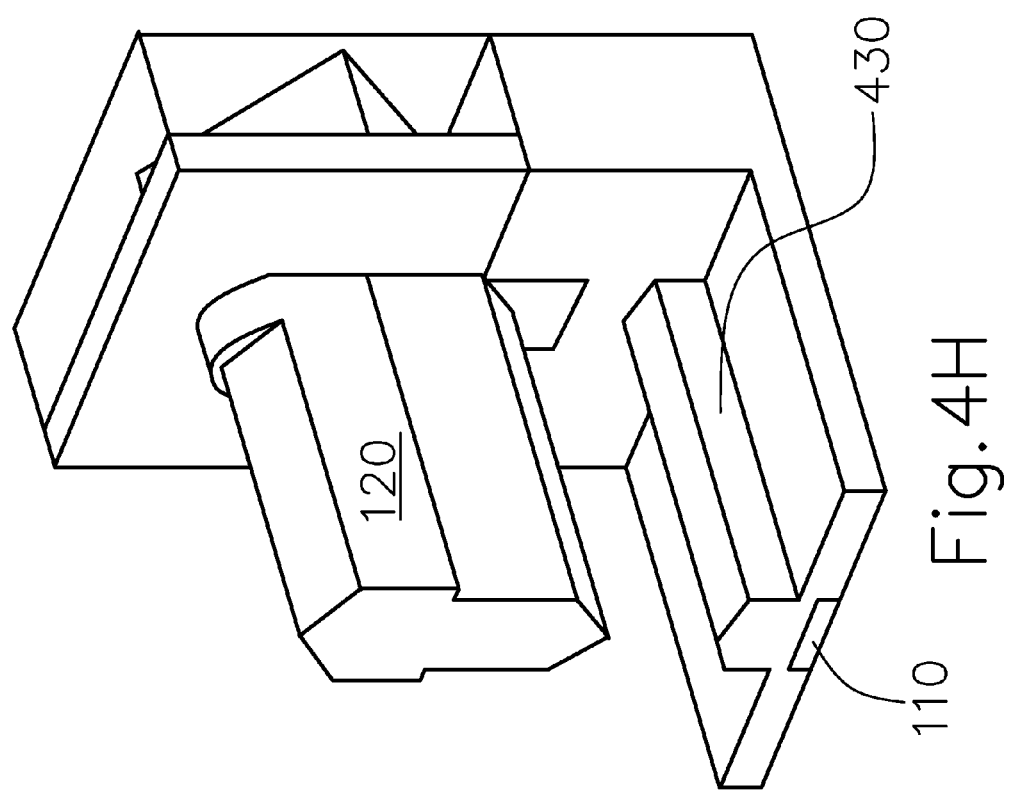

FIG. 4H illustrates an isometric view of a semiconductor structure at a spacer removal stage of fabrication in accordance with embodiments of the instant disclosure. Specifically, a spacer removal process is implemented to free the semiconductor material of the overhead structure 120 from the covering dielectrics. Similar to that discussed previously, the spacer removal process may comprise one or more spacer stripping steps to eventually clean the covering dielectric material off the semiconductor surface of the overhead structure 120. As the dielectric spacers being removed, an exposed overhead channel structure 120 is provided above the insulating structure 430 capping the now fully embedded root structure 110. Particularly, a downward-facing surface of the overhead structure 120 is kept a distance away from an upward-facing surface of the insulating structure 430, therefore allowing the formation of an all-surrounding gate in subsequent steps.

A gate stack formation process comparable to that discussed previously may then take place to complete the fabrication of the semiconductor structure. As discussion on this topic has been provided previously, repetitive details will be omitted here for the brevity of disclosure.

Figure 5A:
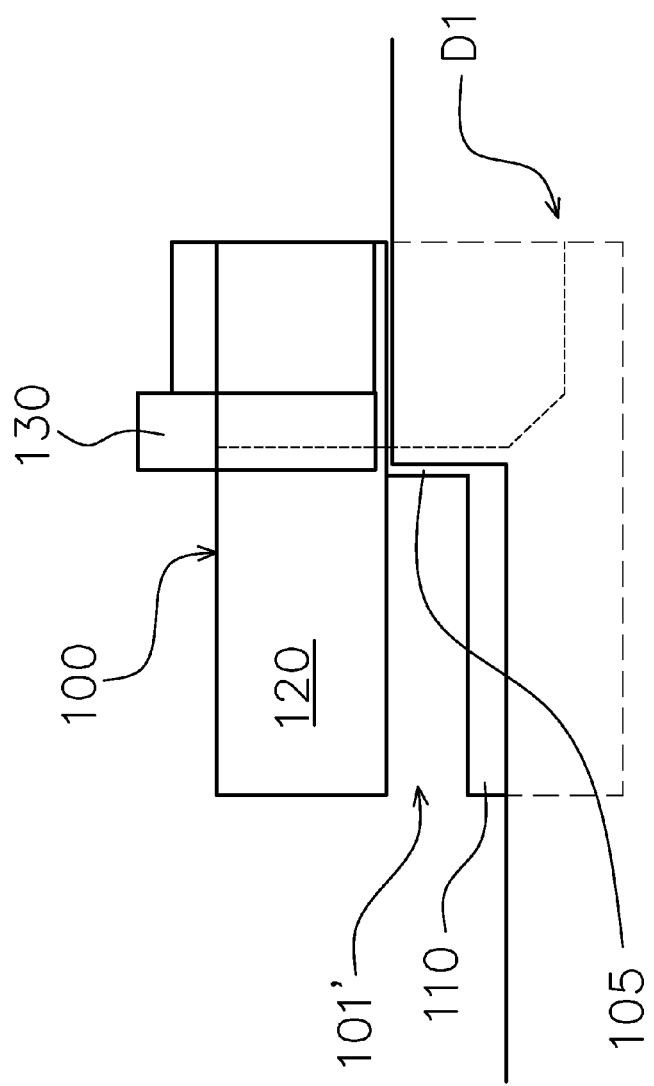
FIGS. 5A-B illustrate partial cross-sectional views of a semiconductor in accordance with embodiments of the instant disclosure.
Figure 5B:
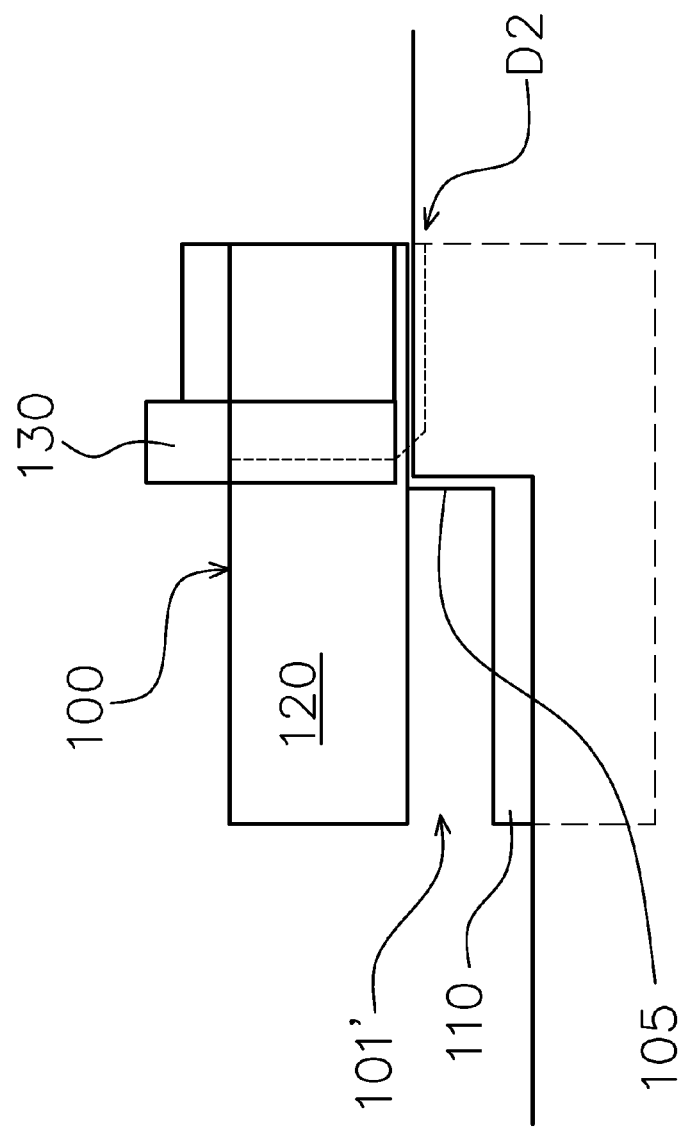

Please refer concurrently to FIGS. 5A and 5B, which illustrate partial cross-sectional views of semiconductor structures in accordance with embodiments of the instant disclosure. As discussed previously, suitable source/drain junction arrangement may be adopted to optimize the advantageous properties of the structural arrangement in accordance with the instant disclosure. FIGS. 5A and 5B are provided to establish a more intuitive/visual illustration of such arrangements. For one thing, a deeper source/drain junction depth (D1) may be suitable for establishing a complementary carrier channel in the upper portion of the embedded root portion 110, as illustrated by FIG. 5A, thereby enabling an increased amount of on-current flow. Conversely, a shallower source/drain junction depth (D2) may be suitable for alleviating parasitic capacitance phenomenon, as illustrated by FIG. 5B, through increasing isolation distance between the suspended overhead channel portion 120 and the embedded root portion 110. Accordingly, by adjusting the source/drain arrangements, the semiconductor structure in accordance with the instant disclosure may be flexibly tuned to meet a various range of application requirements.

As the structural arrangement and fabrication method in accordance with the instant disclosure are highly compatible with existing FinFET process, the economical benefits provided there-by is evident. For instance, through the insertion of few additional steps employing CMOS compatible technology into an established FinFET fabrication process, one may obtain a gate-all-around structure that offers superior performance gain at competitive costs.

Accordingly, one aspect of the instant disclosure provides a semiconductor device, which comprises: an integral semiconductor fin structure having a middle section defining a channel region of the semiconductor device, the middle section includes an embedded root portion protruding from an insulating surface on a substrate and a suspended overhead portion arranged above the root portion, separated from the overhead portion by a predetermined distance, where the root portion and the overhead portion respectively define a substantially identical channel direction; and a gate structure disposed over the fin structure at the middle section thereof, the gate structure wraps around a cross-section of the overhead portion and caps over the protruded portion of the root portion.

Accordingly, another aspect of the instant disclosure provides a semiconductor device, which comprises: an integral semiconductor fin structure having a middle section that includes an root portion embedded under an insulating surface on a substrate and a suspended overhead portion arranged above the root portion and separated therewith by a predetermined distance, where the overhead portion defines an channel direction of the semiconductor device; and a gate structure disposed over the fin structure at the middle section thereof, the gate structure wraps around a cross-section of the overhead portion.

Accordingly, yet another aspect of the instant disclosure provides a method of fabricating a gate-all-around (GAA) structure, which comprises the acts of: providing an integral semiconductor fin structure embeddedly arranged on a substrate, the integral fin structure extending above an insulating surface on the substrate; forming a vertically extending spacer layer covering a lateral surface of a middle section of the integral fin structure that defines a channel region of the GAA structure; recessing the insulating surface embedding the middle section of the integral fin structure to a predetermined depth, thereby exposing an originally embedded portion of the integral fin structure; and etching the exposed lateral surface of the integral fin structure to create an intra-fin structure cavity extending along a predetermined channel direction, thereby separating the middle section of the integral fin structure into an suspended overhead portion and an embedded root portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
  an insulating surface;
  a fin structure including
    a root portion arranged above the insulating surface, and
    an overhead portion arranged above the root portion and separated from the root portion, wherein the root portion and the overhead portion define a cross section that substantially resembles an exclamation mark; and
  a gate structure wrapping around the overhead portion and the root portion.

2. The device of claim 1, wherein the overhead portion defines a channel region and a source/drain region, the device further comprising an arch structure that separates the channel region from the source/drain region.

3. The device of claim 1, wherein the gate structure includes a gate dielectric layer.

4. A semiconductor device, comprising:
  a fin structure including
    a root portion, and
    an overhead portion arranged above the root portion and separated from the root portion;
  a gate structure wrapping around the overhead portion and including a gate dielectric; and
  an insulating structure arranged between the root portion and the gate dielectric of the gate structure.

5. The device of claim 4, wherein the overhead portion defines a channel region and a source/drain region, the device further includes an arch structure that separates the channel region from the source/drain region.

6. A semiconductor device comprising:
  a substrate including lower and upper substrate portions;
  a fin structure formed from the upper substrate portion of the substrate and including
    a root portion that extends from the lower substrate portion of the substrate, and
    an overhead portion that is above and separated from the root portion;
  a gate structure wrapped around the overhead portion of the fin structure;

a source/drain region at an end section of the overhead portion of the fin structure; and an arch structure between the gate structure and the source/drain region.

7. The semiconductor device of claim 6, wherein the gate structure further wraps around the root portion of the fin structure.

8. The semiconductor device of claim 6, further comprising a spacer layer between the root portion of the fin structure and the gate structure.

9. The semiconductor device of claim 6, further comprising an interlayer dielectric between the root portion of the fin structure and the gate structure.

10. A semiconductor device comprising:
a substrate including lower and upper substrate portions;
a fin structure formed from the upper substrate portion of the substrate and including
 a root portion that extends from the lower substrate portion of the substrate, and
 an overhead portion that is above and separated from the root portion;
a gate structure wrapped around the overhead portion of the fin structure and including a gate dielectric; and
a dielectric layer between the root portion of the fin structure and the gate structure and having the same material as the gate dielectric of the gate structure.

11. The semiconductor device of claim 6, wherein the root portion of the fin structure is partially oxidized.

12. A semiconductor device comprising:
a substrate including lower and upper substrate portions;
a fin structure formed from the upper substrate portion of the substrate and including
 a root portion that extends from the lower substrate portion of the substrate, and
 an overhead portion that is above and separated from the root portion;
a gate structure wrapped around the overhead portion of the fin structure; and
an epitaxial layer grown on the overhead portion of the fin structure.

13. The semiconductor device of claim 6, further comprising a shallow trench isolation (STI) feature around the root portion of the fin structure.

* * * * *